(12) United States Patent
Chern et al.

(10) Patent No.: US 11,393,939 B2
(45) Date of Patent: Jul. 19, 2022

(54) PHOTO SENSING DEVICE AND METHOD OF FABRICATING THE PHOTO SENSING DEVICE

(71) Applicant: TAIWAN SEMICONDUCTOR MANUFACTURING COMPANY LTD., Hsinchu (TW)

(72) Inventors: Chan-Hong Chern, Palo Alto, CA (US); Weiwei Song, San Jose, CA (US); Chih-Chang Lin, San Jose, CA (US); Lan-Chou Cho, Hsinchu (TW); Min-Hsiang Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 92 days.

(21) Appl. No.: 16/921,858

(22) Filed: Jul. 6, 2020

(65) Prior Publication Data

US 2021/0091245 A1 Mar. 25, 2021

Related U.S. Application Data

(60) Provisional application No. 62/903,242, filed on Sep. 20, 2019.

(51) Int. Cl.
*H01L 31/0352* (2006.01)
*H01L 31/105* (2006.01)
(Continued)

(52) U.S. Cl.
CPC ........ *H01L 31/035254* (2013.01); *G01J 1/42* (2013.01); *H01L 31/035281* (2013.01); *H01L 31/105* (2013.01); *H01L 31/1804* (2013.01)

(58) Field of Classification Search
CPC .......... H01L 31/028; H01L 31/035281; H01L 31/105; H01L 31/1804; H01L 31/035272;
(Continued)

(56) References Cited

U.S. PATENT DOCUMENTS 5,796,118 A * 8/1998 Morikawa ....... H01L 31/035254
257/19
6,075,253 A * 6/2000 Sugiyama ............. H01L 31/028
257/19
(Continued)

FOREIGN PATENT DOCUMENTS

DE 102015212208 A1 * 10/2016 ....... H01L 31/02005
EP 3038167 A1 * 6/2016 ........... H01L 31/028
(Continued)

OTHER PUBLICATIONS

Chen, "Advanced Germanium P-i-n and Avalanche Photodetectors for Low-Power Optical Interconnects," Ghent University, Faculty of Engineering and Architecture, 186 pages, (Year: 2016).*
(Continued)

*Primary Examiner* — Earl N Taylor
(74) *Attorney, Agent, or Firm* — WPAT, P.C. Intellectual Property Attorneys; Anthony King

(57) ABSTRACT

The present disclosure provides a photo sensing device, the photo sensing device includes a substrate, including a silicon layer at a front surface, a photosensitive member extending into and at least partially surrounded by the silicon layer, and a superlattice layer disposed between the photosensitive member and the silicon layer, wherein the superlattice layer includes a first material and a second material different from the first material, a first concentration of the second material at a portion of the superlattice layer proximal to the photosensitive member is greater than a second concentration of
(Continued)

the second material at a portion of the superlattice layer distal to the photosensitive member.

20 Claims, 30 Drawing Sheets

(51) Int. Cl.
  *H01L 31/18* (2006.01)
  *G01J 1/42* (2006.01)
(58) Field of Classification Search
  CPC . H01L 31/09; H01L 31/184; H01L 31/03529; H01L 21/02507; H01L 21/0251; H01L 31/035236; H01L 31/035254; H01L 31/035263; Y02P 70/50; G02F 1/01716; G02B 6/12
  See application file for complete search history.

(56) References Cited

U.S. PATENT DOCUMENTS

| | | | | |
|---|---|---|---|---|
| 6,136,628 | A * | 10/2000 | Sugiyama | H01L 31/107 257/E31.063 |
| 6,307,242 | B1 * | 10/2001 | Sugiyama | H01L 31/028 257/188 |
| 6,943,409 | B1 * | 9/2005 | Cheng | H01L 27/1446 257/330 |
| 7,397,101 | B1 * | 7/2008 | Masini | H01L 31/028 257/184 |
| 9,437,759 | B2 * | 9/2016 | Baehr-Jones | H01L 31/107 |
| 9,553,222 | B2 * | 1/2017 | Baehr-Jones | H01L 31/107 |
| 9,812,598 | B2 * | 11/2017 | Baehr-Jones | H01L 27/14638 |
| 10,043,927 | B2 * | 8/2018 | Baehr-Jones | H01L 31/028 |
| 10,121,927 | B2 * | 11/2018 | Nakayama | H01L 31/1804 |
| 10,134,938 | B2 * | 11/2018 | Novack | H01L 31/028 |
| 10,158,036 | B2 * | 12/2018 | Usami | H01L 31/1804 |
| 10,901,150 | B2 * | 1/2021 | Novack | G02B 6/1225 |
| 2010/0006961 | A1 * | 1/2010 | Yasaitis | H01L 27/1443 257/431 |
| 2011/0012221 | A1 * | 1/2011 | Fujikata | G02B 6/12004 257/458 |
| 2011/0037133 | A1 * | 2/2011 | Su | H01L 31/035281 257/432 |
| 2015/0016769 | A1 * | 1/2015 | Verma | H01L 31/105 385/14 |
| 2017/0012143 | A1 * | 1/2017 | Usami | H01L 31/1808 |
| 2017/0018457 | A1 * | 1/2017 | Schulze | H01L 29/0615 |
| 2017/0179316 | A1 * | 6/2017 | Balakrishnan | H01L 31/1804 |
| 2017/0317221 | A1 * | 11/2017 | Usami | G02B 6/00 |
| 2019/0280146 | A1 * | 9/2019 | Baudot | H01L 31/02327 |
| 2019/0378949 | A1 * | 12/2019 | Simoyama | H01L 31/105 |
| 2020/0313021 | A1 * | 10/2020 | Fujikata | H01L 31/02327 |
| 2020/0393618 | A1 * | 12/2020 | Novack | H01L 31/02327 |
| 2021/0066535 | A1 * | 3/2021 | Ludurczak | H01L 31/02005 |
| 2021/0074814 | A1 * | 3/2021 | Stephenson | H01L 21/28518 |
| 2021/0091239 | A1 * | 3/2021 | Chern | H01L 31/028 |
| 2021/0091245 | A1 * | 3/2021 | Chern | H01L 31/105 |
| 2021/0091246 | A1 * | 3/2021 | Chern | H01L 31/022408 |

FOREIGN PATENT DOCUMENTS

| | | | | |
|---|---|---|---|---|
| EP | 3462232 A1 * | 4/2019 | | G02F 1/025 |
| JP | H10163515 A * | 6/1998 | | H01L 31/103 |
| JP | 2014183195 A * | 9/2014 | | H01L 27/14649 |
| KR | 20090062483 A * | 6/2009 | | H01L 31/028 |
| WO | WO-2015187222 A2 * | 12/2015 | | H01L 27/14649 |

OTHER PUBLICATIONS

Virot et al., "Integrated waveguide PIN photodiodes exploiting lateral Si/Ge/Si heterojunction," Opt. Express 25, 19487-19496, (Year: 2017).*

Benedikovic et al., "25 Gbps low-voltage hetero-structured silicon-germanium waveguide pin photodetectors for monolithic on-chip nanophotonic architectures," Photon. Res. 7, 437-444, (Year: 2019).*

* cited by examiner

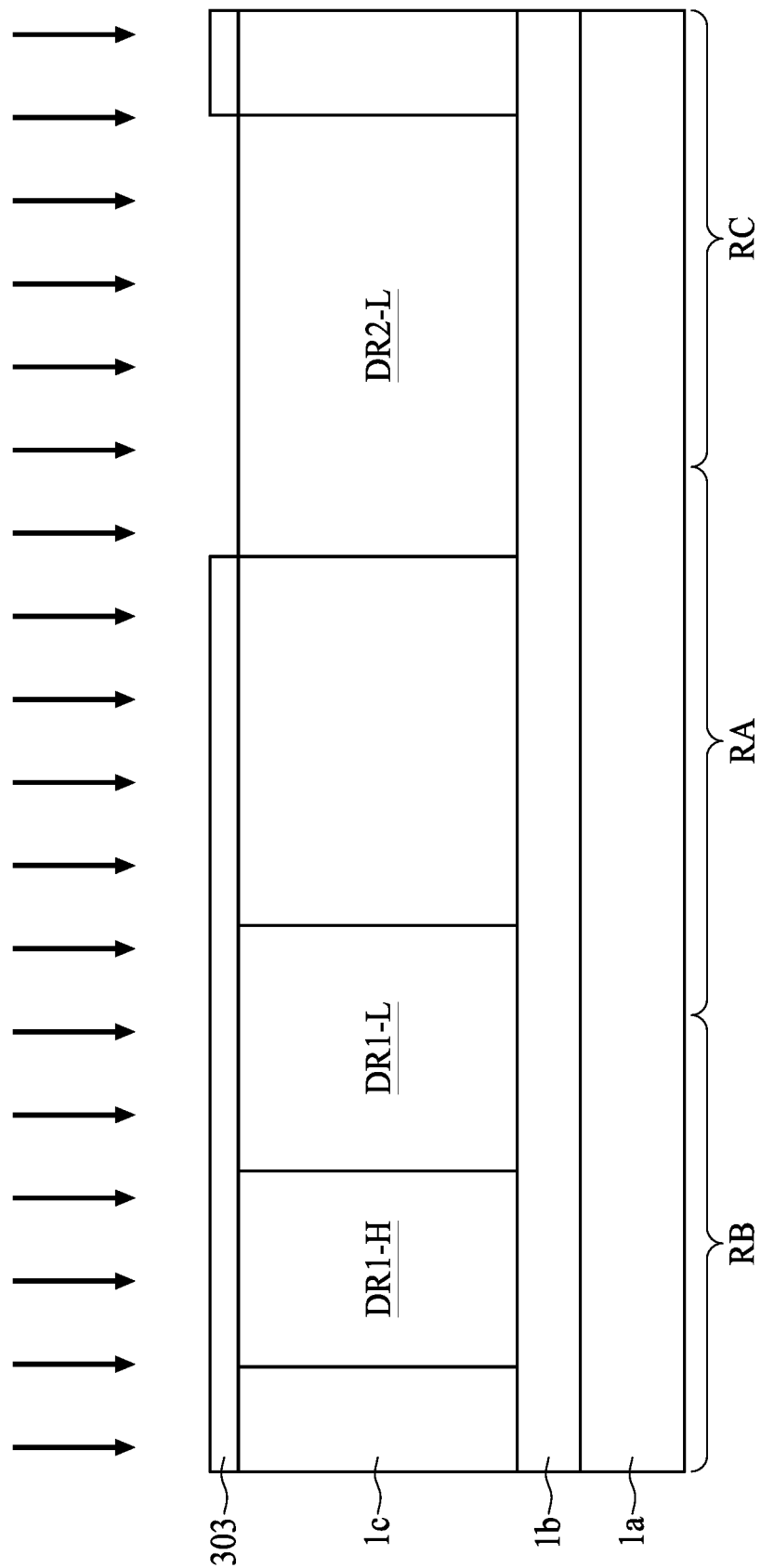

PHOTO SENSING DEVICE AND METHOD OF FABRICATING THE PHOTO SENSING DEVICE

CROSS REFERENCE TO RELATED APPLICATIONS

This application claims the benefit of prior-filed provisional application No. 62/903,242, filed Sep. 20, 2019, which is incorporated by reference in its entirety.

BACKGROUND

In recent years, the semiconductor integrated circuit (IC) industry has experienced rapid growth. Technological advances in IC materials and design have produced generations of ICs where each generation has smaller and more complex circuits than the previous generation.

Photo sensing devices are used to sense radiation such as light. These devices often use arrays of pixels or photodiodes to absorb radiation projected thereto and convert the sensed radiation into electrical signals. As a part of evolution, the size of photo sensing device can be reduced. However, issues related to dark current are more and more difficult to deal with, and furthermore, as the pixel sizes decrease, the amount of photons received by the photo sensing device decreases. As a result, the effect of dark current becomes more pronounced. Therefore, minimizing dark current is a critical issue for advanced technology. Furthermore, photo sensing device often suffers dopant diffusion issues, wherein the speed of detection of the photo sensing device may be reduced due to undesired diffusion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
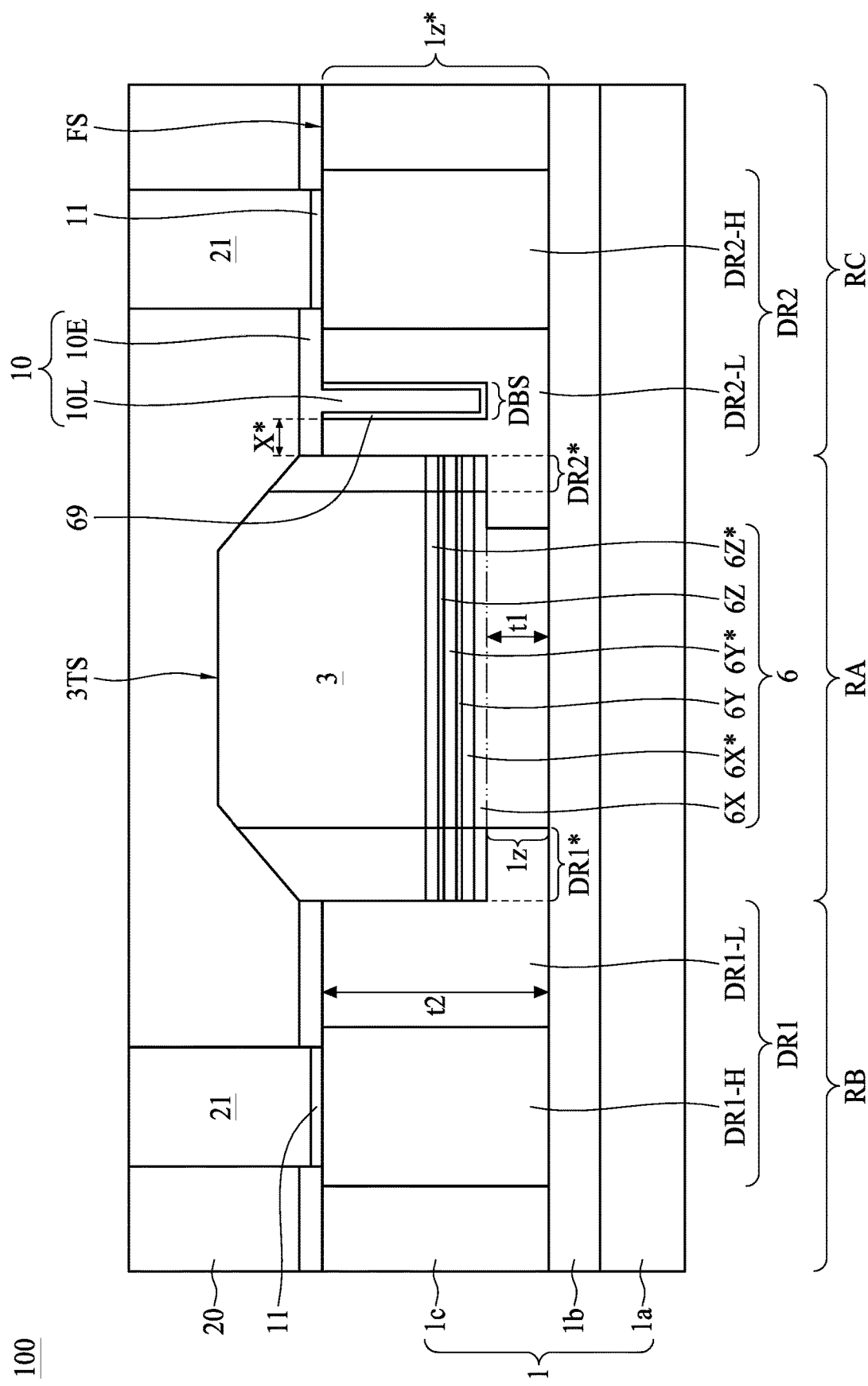
FIG. 1 is a schematic drawing illustrating a cross sectional view of a photo sensing device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Photosensitive materials can be utilized in photo sensing devices to absorb radiation, such as light, and convert the sensed radiation into electrical signal. In some embodiments, germanium (Ge) can be a material of a photosensitive layer. Particularly in the case of having a substrate including silicon at a top surface, it is beneficial to utilize germanium as the photosensitive materials for absorbing light with wavelength less than an infrared wavelength of less than 1,560 nm-1,600 nm since it is easier and cheaper to integrate germanium with silicon photonics. In the application of communication, devices integrated with germanium sensing layer can be utilized for data-communication (signal having wavelength about 1,310 nm) and longer distance tele-communication (signal having wavelength about 1,550 nm).

However, dislocation defects often arise in the cases of epitaxially growing a material on a substrate having different kinds of materials—often referred to as "heterostructure"—due to different crystalline lattice sizes. During the deposition operation, this lattice mismatch between the substrate and the deposited material causes stress during thermal cycles and may lead to dislocation defects. As a result, this may introduce undesired and abrupt changes in electrical and/or optical properties, which result in deteriorated device performance and/or negative effects (e.g. larger dark current). It is discovered that dark current may cause degraded performance, issues or failures, such as degrading signal-to-noise-ratio (SNR). In addition, in some cases threading dislocation may degrade physical properties of the dislocation and may lead to device failure.

In the example of growing germanium on a silicon substrate, there is a difference between a lattice constant of silicon and a lattice constant of germanium (about 4.2% under certain circumstances). It should be noted that when a thickness of germanium deposited thereon is less than a certain value (for example, 20 Å), the lattice mismatch may not cause obvious misfit dislocation since thinner germanium can be compressed (conformed to silicon lattice) and the lattice mismatch can be alleviated. However, in order to effectively absorbing signals within a certain range (for example, up to about 1,650 nm so that the device can be applied in the field of data-communication and tele-communication), it is more desired for such photo sensing layer to have a thickness greater than a value (for example, greater than 4,000 Å, or can be varied based on the need of certain application. In the example, when the thickness is significantly less than 4,000 Å, the collection of radiation may not be effective). In such case, on the contrary, lattice mismatch may cause detectable misfit dislocation or even threading dislocation, which may lead to degraded device performance, as the lattice mismatch may not be effectively alleviated by material conformation herein due to greater thickness.

In addition, a portion of the substrate may be removed before forming another material thereon. However, the exposed surface after such removal operation may be rough, and such rough surface serving as the starting surface may aggravate the issue of misfit dislocation and/or threading dislocation, which may lead to undesired effect such as dark current.

Furthermore, during fabrication of a photo sensing device, dopant (such as phosphorus, arsenic, n-type dopant, or other types of dopant) may diffuse quickly in photo sensing material (such as germanium or other semiconductor material) through an interface, which may result in undesired dopant diffusion into an intended intrinsic region, reduced photodetector bandwidth, and/or lowered detection speed.

The present disclosure provides a photo sensing device and method(s) for forming the photo sensing device in order to improve the device performance (which may be reflected on device detection speed) and mitigate the aforesaid issues (such as dark current and diffusion at interface). It should be noted that in the present disclosure, a germanium photosensitive layer forming on a silicon surface is used as an example. However, other suitable materials or compositions may also be used as a photosensitive layer or a substrate. For example, III-V group material (such as InGaAs, InP, etc.), other IV group material, or other combination/composition thereof may be other types of material that can be utilized as a photosensitive material in the application of photodetector.

The term "starting surface" for epitaxial growth refers to a surface provided as an underlying surface for growing an epitaxial layer thereon, wherein the starting surface may be in direct contact with the epitaxial layer after growth operation. The term "intrinsic" refers to a semiconductor material without intentionally adding dopants.

FIG. 1 is a schematic drawing illustrating a cross sectional view of a photo sensing device, according to some embodiments of the present disclosure. A photo sensing device 100 at least includes a substrate 1 and a photosensitive member 3 formed over a first side FS of the substrate 1. The substrate 1 has a first semiconductor material at the first side FS. In some embodiments, the first semiconductor material is silicon and the substrate 1 is a silicon-on-insulator (SOI) substrate, that is, includes a silicon base layer 1$a$, an insulation layer 1$b$ over the silicon base layer 1$a$, and a surface layer 1$c$ over the insulation layer 1$b$. In some embodiments, the insulation layer 1$b$ can be a buried oxide (BOX) layer. In some embodiments, the surface layer 1$c$ includes silicon or intrinsic silicon. Alternatively in some other embodiments, the substrate 1 is a silicon bulk substrate (which allows the photosensitive member 3 to be disposed on a silicon layer at the surface) or other types of substrates suitable for being applied in the field of photo sensing device.

In some embodiments, the photosensitive member 3 includes a second semiconductor material different from the first semiconductor material. In some embodiments, the second semiconductor material is an epitaxial layer. In some embodiments, the second semiconductor material is germanium. In some embodiments, the photosensitive member 3 is made from intrinsic germanium. Alternatively in some other embodiments, the photosensitive member 3 includes other materials that can be utilized to absorb radiation, such as light, and further convert the radiation into electrical signal. It should be noted that a lattice constant of the first semiconductor material is different from a lattice constant of the second semiconductor material. For example, in the case of the first semiconductor material is silicon and the second semiconductor material is germanium, the difference thereof may be around 4.2% under certain circumstances.

A portion of the photosensitive member 3 is formed over a first region RA in the substrate 1. In some embodiments, the photosensitive member 3 extends into and is at least partially surrounded by the substrate 1. In some embodiments, a lower portion of the photosensitive member 3 is laterally surrounded by the surface layer 1$c$ of the substrate 1, and an upper portion of the photosensitive member 3 protrudes from the first side FS of the substrate 1. The photosensitive member 3 may have a top surface 3TS, wherein the top surface 3TS of the upper portion of the photosensitive member 3 has a facet tapering toward the top surface 3TS.

Furthermore, a first portion 1$z$ of the surface layer 1$c$ directly under the photosensitive member 3 has a first thickness t1 less than a second thickness t2 of a second portion 1$z$* of the surface layer 1$c$ surrounding the first portion 1$z$. The second portion 1$z$* of the surface layer 1$c$ is over a second region RB and a third region RC, wherein the second region RB and the third region RC may be adjacent to the first region RA, the second region RB is at a first side of the first region RA and the third region RC is at a second side of the first region RA opposite to the first side. Alternatively stated, the surface layer 1$c$ has an inner sidewall over a boundary between the first portion 1$z$ and the second portion 1$z$*.

The photo sensing device 100 further includes a superlattice stack 6 spacing between the photosensitive member 3 and the substrate 1. The superlattice stack 6 is interposed between a bottom surface of the photosensitive member 3 and a top surface of the first portion 1z of the surface layer 1c. The superlattice stack 6 includes a structure of multiple ultra-thin layers. The superlattice stack 6 at least includes a first material and a second material different from the first material. For example (shown in FIG. 1), the superlattice stack 6 includes a first first-type layer 6X, a first second-type layer 6X*  over the first first-type layer 6X, a second first-type layer 6Y over the first second-type layer 6X*, a second second-type layer 6Y* over the second first-type layer 6Y, a third first-type layer 6Z over the second second-type layer 6Y*, and a third second-type layer 6Z* over the third first-type layer 6Z, et cetera. The first first-type layer 6X, the second first-type layer 6Y and the third first-type layer 6Z may include identical or similar material. Each of the first second-type layer 6X*, the second second-type layer 6Y* and the third second-type layer 6Z* may include identical or similar material, wherein the second material of each layer may optionally include different molar ratio of specific material, as will be discussed subsequently.

In some embodiments, the first material is identical or similar to the material of the substrate 1 or surface layer 1c (for example, intrinsic silicon or silicon), and the second material identical or similar to the material of the photosensitive member 3 (for example, intrinsic germanium or germanium). In the case of the substrate 1/surface layer 1c include intrinsic silicon and photosensitive member 3 includes intrinsic germanium, the superlattice stack 6 may include intrinsic silicon (or silicon) and silicon germanium, wherein the term "silicon germanium" is referred to as $Ge_xSi_{1-x}$, wherein $0<x<1$. In some embodiments, intrinsic silicon (or silicon) and silicon germanium are alternately disposed in the superlattice stack 6. For the discussed example (shown in FIG. 1), the first first-type layer 6X, the second first-type layer 6Y, and the third first-type layer 6Z can include intrinsic silicon (or silicon), and the first second-type layer 6X*, the second second-type layer 6Y*, and the third second-type layer 6Z* includes silicon germanium.

Generally speaking, since it is easier for a thinner layer to be compressed than a thicker layer, wherein the lattice constant of a layer can be mildly altered based on a lattice constant of the underlying layer below. Thus, the alternating ultra-thin layers having different lattice constant may alleviate the lattice mismatch of different materials due to relatively prominent compression effect, wherein the lattice constant of each layer can be transitionally adjusted based on the underlying layer and the starting surface configured to have the photosensitive member 3 grew thereon thereby have an effective lattice constant closer to the second semiconductor material of the photosensitive member 3 (such as germanium), comparing to a lattice constant difference between the photosensitive member 3 and the first portion 1z of the surface layer 1c, which is relatively distal from the photosensitive member 3.

Furthermore, in order to further improve the transitional adjustment of lattice constant of each ultra-thin layers, the distribution of molar concentration of some of the layers can be adjusted. It is discovered that the lattice constant is related to the composition of a material. For example, in the case of the material of the second-type layers can be represented as $Ge_xSi_{1-x}$ ($0<x<1$), the lattice constant of the second-type layers is related to the molar ratio of germanium. The lattice constant of a second-type layer may be closer to the lattice constant of the photosensitive member 3 (which may include germanium or intrinsic germanium) when x is closer to 1. Therefore, by having a first concentration of the second material (such as germanium or intrinsic germanium) at a first portion of the superlattice stack 6 proximal to the photosensitive member 3 greater than a second concentration of the second material at a second portion of the superlattice stack 6 distal to the photosensitive member 3 and below the first portion, the configuration of the superlattice stack 6 may further improve the transitional adjustment of the lattice constant. Such transitional adjustment of the lattice constant may allow the superlattice stack 6 to provide an improved starting surface (i.e. a top surface) for epitaxially growing the photosensitive member 3 thereon. Since the starting surface of the superlattice stack 6 may have a lattice constant closer to the photosensitive member 3, the dislocation issue caused by lattice mismatch (such as misfit dislocation and threading dislocation) may be alleviated.

For the aforesaid example shown in FIG. 1, each of the second-type layer, which may include $Ge_xSi_{1-x}$, may have different molar concentration of germanium (x). Generally, the molar concentration of germanium (x) is greater at a layer closer to the photosensitive member 3 than the molar concentration of germanium (x) at a layer distal from the photosensitive member 3. That is, the x of the third second-type layer 6Z* is greater than the x of the second second-type layer 6Y*, the x of the second second-type layer 6Y* is greater than the x of the first second-type layer 6X*. For example, the composition of each layers can be: the first first-type layer 6X includes intrinsic silicon, the first second-type layer 6X* includes $Ge_{0.1}Si_{0.9}$ (where x=0.1), the second first-type layer 6Y includes intrinsic silicon, the second second-type layer 6Y* includes $Ge_{0.75}Si_{0.25}$ (where x=0.75), the third first-type layer 6Z includes intrinsic silicon, and the third second-type layer 6Z* includes $Ge_{0.9}Si_{0.1}$ (where x=0.9). It should be noted that the molar concentration of the second material of each second-type layer, the total number of first-type and second-type layers, the thickness thereof and the difference of x between two adjacent second-type layers may be varied or adjusted based on design rule or the need of configuration. In some embodiments, the lattice conformation effect is more evident when a thickness of the ultra-thin layer is thinner than 20 nm (or in some cases, thinner than 10 nm or 1 nm).

Comparing to a comparative embodiment of having a photosensitive member directly disposed on a substrate, with the configuration of the superlattice stack 6 between the photosensitive member 3 and the substrate 1 in the present disclosure, the lattice mismatch between the photosensitive member 3 and the semiconductor layer of the superlattice stack 6 in direct contact with the photosensitive member 3 may be effectively reduced. For example, a top surface of the superlattice stack 6 for epitaxially growing the photosensitive member 3 has a lattice constant closer to the material of the photosensitive member 3, for example, intrinsic germanium.

In some embodiments, doped regions can be formed in the substrate 1 in order to create electrical properties. For example, a first doped region DR1 having a first conductivity type (for example, p-type) is formed over the second region RB and adjacent to the photosensitive member 3. A second doped region DR2 having a second conductivity type different from the first conductivity type (for example, n-type, such as phosphorous or arsenic) is formed over the third region RC opposite to the second region RB with regard to the photosensitive member 3, and adjacent to the photosensitive member 3. In some embodiments, the first doped region DR1 includes a lightly doped region DR1-L (wherein the concentration of the dopant can be referred as p+ in some examples) proximal to the photosensitive member 3 and a heavily doped region DR1-H (wherein the concentration of the dopant can be referred as p++ in some examples) adjacent to the lightly doped region DR1-L. In some embodiments, the second doped region DR2 includes a lightly doped region DR2-L (wherein the concentration of the dopant can be referred as n+ in some examples) proximal to the photosensitive member 3 and a heavily doped region DR2-H (wherein the concentration of the dopant can be referred as n++ in some examples) adjacent to the lightly doped region DR2-L.

Optionally, a third doped region DR1* having the first conductivity type can be formed in the photosensitive member 3 at a side adjacent to the lightly doped region DR1-L. In some embodiments, the third doped region DR1* may further include a portion of the first portion 1z of the surface layer 1c and a portion of the superlattice stack 6 adjacent to the lightly doped region DR1-L. Optionally, a fourth doped region DR2* having the second conductivity type can be formed in the photosensitive member 3 at a side adjacent to the lightly doped region DR2-L. In some embodiments, the fourth doped region DR2* may further include a portion of the first portion 1z of the surface layer 1c and a portion of the superlattice stack 6 adjacent to the lightly doped region DR2-L.

A diffusion barrier structure DBS is formed at the first side FS of the substrate 1 and spaced away from the photosensitive member 3. In some embodiments, the diffusion barrier structure DBS extends into the surface layer 1c and is at least partially surrounded by the surface layer 1c. At least a portion of the surface layer 1c is between the photosensitive member 3 and the diffusion barrier structure DBS. The diffusion barrier structure DBS includes a dielectric layer 10 and a diffusion barrier layer 69 surrounding a lower portion 10L of the dielectric layer 10. The term "diffusion barrier structure" may mean a structure that seeks to prevent spreading of dopant in a region via diffusion, especially under annealing operation, to another region where properties thereof may be affected by the dopant. For example, the diffusion barrier structure DBS is formed in the second doped region DR2 having a second conductivity type (such as n-type), or in some cases, in the lightly doped region DR2-L. As previously discussed, during the fabrication operations that require elevated temperature, the photosensitive member 3 may suffer from the diffusion from the adjacent doped region. Diffusion of n-type dopant (such as phosphorous or arsenic) may occur during or after high-thermal budget operation. Therefore, the diffusion barrier structure DBS is configured to laterally separate a portion of the second doped region DR2 from the photosensitive member 3. It should be noted that another diffusion barrier structure DBS may optionally be disposed in the first doped region DR1, but the present disclosure is not limited thereto.

In some embodiments, the diffusion barrier layer 69 may include silicon nitride, nitrided oxide, or other material that can be utilized as buffer layer for alleviating dopant diffusion. In some embodiments, the nitrided oxide further provides a smoother surface for forming the dielectric layer 10. In some embodiments, the dielectric layer 10 may include silicon oxide ($SiO_2$) or silicon nitride (SiN). In some embodiments, the dielectric layer 10 further include an upper portion 10E covering the first side FS of the substrate 1. The photosensitive member 3 protrudes from and is partially surrounded by the upper portion 10E of the dielectric layer 10. In some alternative embodiments, the insulation layer 10 may also cover the top surface 3TS of the photosensitive member 3. Optionally, in some of the embodiments, the photosensitive member 3 may be in direct contact with the upper portion 10E of the dielectric layer 10.

In some embodiments, a lateral distance X* between a sidewall of the photosensitive member 3 (or a sidewall of the superlattice stack 6) and the diffusion barrier structure DBS is in a range from about 20 nm to about 100 nm. In some embodiments, since the diffusion barrier structure DBS may include electrical insulation or high resistance material, placing the diffusion barrier structure DBS less than 20 nm from the photosensitive member 3 may deteriorate detection speed or device performance since the electrical property may be affected. When the lateral distance X* is greater than 100 nm, the performance of confining the dopant from diffusing into the photosensitive member 3 may not be desirable since the portion of the substrate 1 doped with dopant between the diffusion barrier structure DBS and the photosensitive member 3 may possess too much dopant that may not be obstructed from diffusing into the photosensitive member 3. In order to alleviate dopant diffusion, especially from the second doped region DR2, the lateral distance X* between the sidewall of the photosensitive member 3 and the diffusion barrier structure DBS is less than 100 nm and greater than 20 nm to reduce the quantity of dopant between the photosensitive member 3 and the diffusion barrier structure DBS without causing undesirably high resistance of the photo sensing device 100.

A silicide layer 11 may be formed above the heavily doped regions DR1-H and DR2-H and surrounded by the upper portion 10E of the dielectric layer 10. A capping layer 20 may be formed above the dielectric layer 10 and the top surface 3TS of the photosensitive member 3. In some alternative embodiments, the insulation layer 10 may also cover the top surface 3TS of the photosensitive member 3. The capping layer 20 may include insulation materials, such as silicon nitride (SiN) or oxide. A plurality of conductive contacts 21 may be formed in the capping layer 20 and respectively electrically connected to the silicide layer 11. In some embodiments, the conductive contacts 21 include metal. In some embodiments, the conductive contacts 21 may be directly above the heavily doped regions DR1-H and DR2-H. In some embodiments, the conductive contacts 21 may have a top surface coplanar with a top surface of the capping layer 20.

Figure 2A:
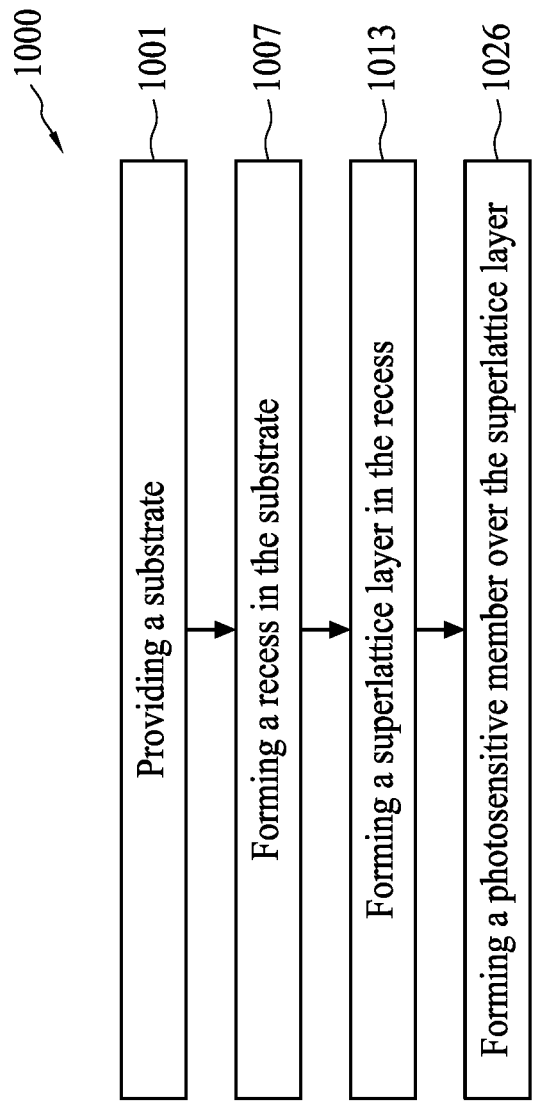
FIG. 2A shows a flow chart representing a method for fabricating a photo sensing device, in accordance with some embodiments of the present disclosure.

FIG. 2A shows a flow chart representing a method for fabricating a photo sensing device, in accordance with some embodiments of the present disclosure. The method 1000 for fabricating a photo sensing device includes providing a substrate (operation 1001, which can be referred to FIG. 3A), forming a recess in the substrate (operation 1007, which can be referred to FIG. 3N), forming a superlattice layer in the recess (operation 1013, which can be referred to FIG. 3O), and forming a photosensitive member over the superlattice layer (operation 1026, which can be referred to FIG. 3P).

Figure 2B:
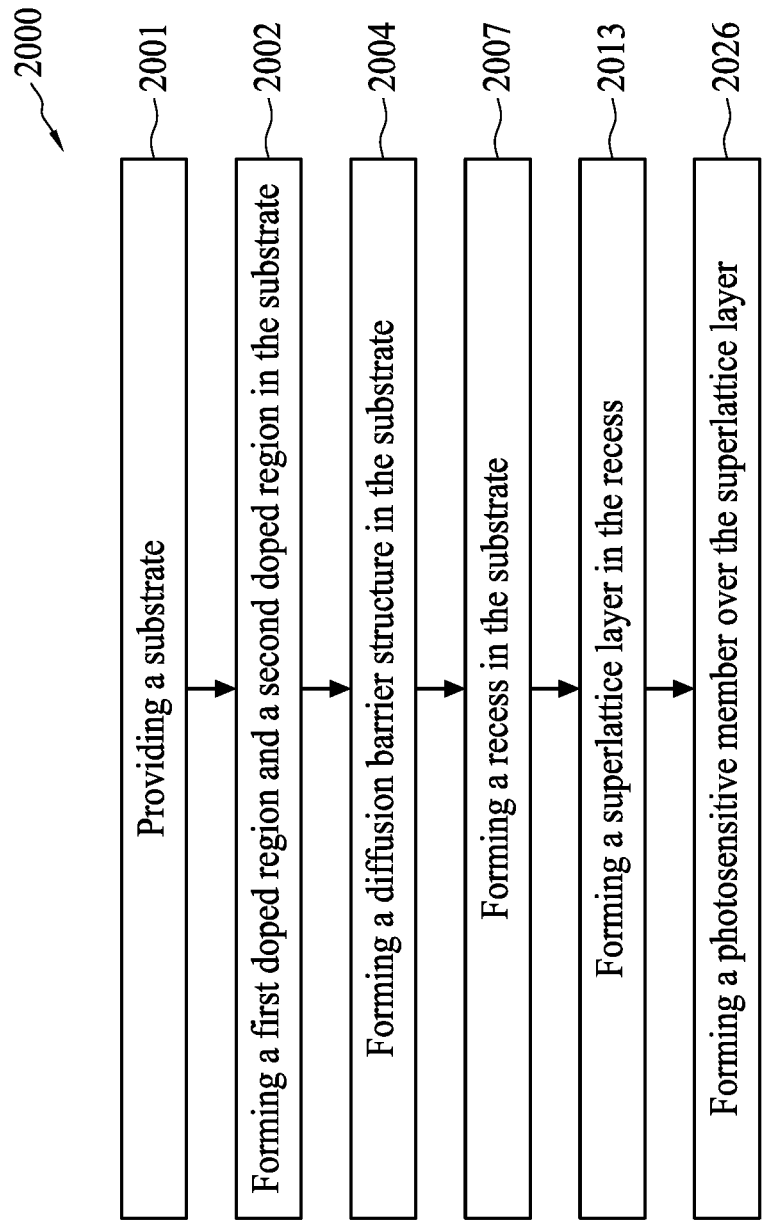
FIG. 2B shows a flow chart representing a method for fabricating a photo sensing device, in accordance with some embodiments of the present disclosure.

FIG. 2B shows a flow chart representing a method for fabricating a photo sensing device, in accordance with some embodiments of the present disclosure. The method 2000 for fabricating a photo sensing device includes providing a substrate (operation 2001, which can be referred to FIG. 3A), forming a first doped region and a second doped region in the substrate (operation 2002, which can be referred to FIG. 3B to FIG. 3E), forming a diffusion barrier structure in the substrate (operation 2004, which can be referred to FIG. 3F to FIG. 3K), forming a recess in the substrate (operation 2007, which can be referred to FIG. 3N), forming a super-lattice layer in the recess (operation 2013, which can be referred to FIG. 3O), and forming a photosensitive member over the superlattice layer (operation 2026, which can be referred to FIG. 3P).

Figure 2C:
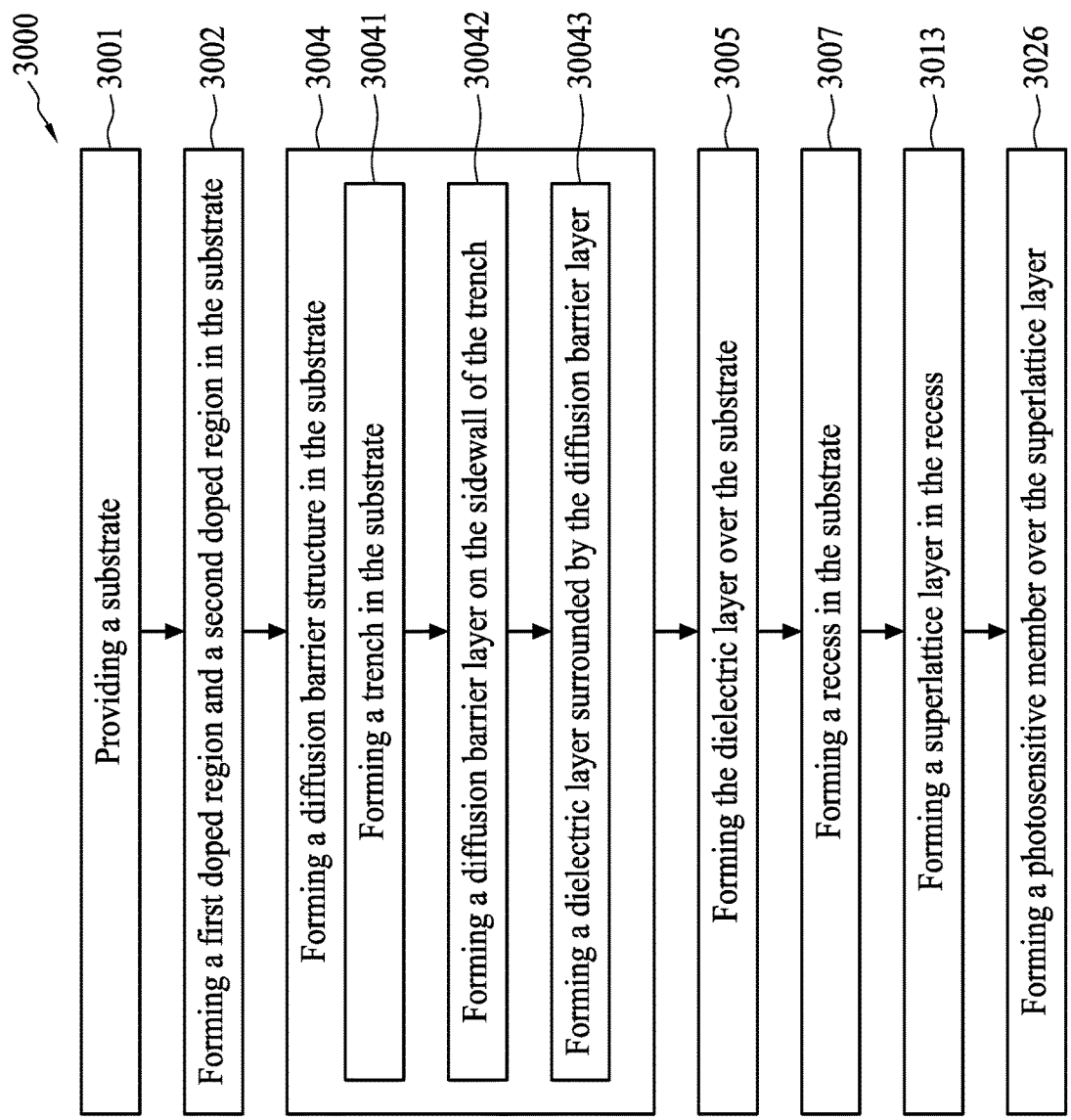
FIG. 2C shows a flow chart representing a method for fabricating a photo sensing device, in accordance with some embodiments of the present disclosure.

FIG. 2C shows a flow chart representing a method for fabricating a photo sensing device, in accordance with some embodiments of the present disclosure. The method 3000 for fabricating a photo sensing device includes providing a substrate (operation 3001, which can be referred to FIG. 3A), forming a first doped region and a second doped region in the substrate (operation 3002, which can be referred to FIG. 3B to FIG. 3E), forming a diffusion barrier structure in the substrate (operation 3004, which can be referred to FIG. 3F to FIG. 3K), forming the dielectric layer over the substrate (operation 3005, which can be referred to FIG. 3J to FIG. 3K), forming a recess in the substrate (operation 3007, which can be referred to FIG. 3N), forming a superlattice layer in the recess (operation 3013, which can be referred to FIG. 3O), forming a photosensitive member over the superlattice layer (operation 3026, which can be referred to FIG. 3P). Operation 3004 further includes forming a trench in the substrate (sub-operation 30041, which can be referred to FIG. 3G), forming a diffusion barrier layer on the sidewall of the trench (sub-operation 30042, which can be referred to FIG. 3H), and forming a dielectric layer surrounded by the diffusion barrier layer (sub-operation 30043, which can be referred to FIG. 3J to FIG. 3K).

Figure 3A:
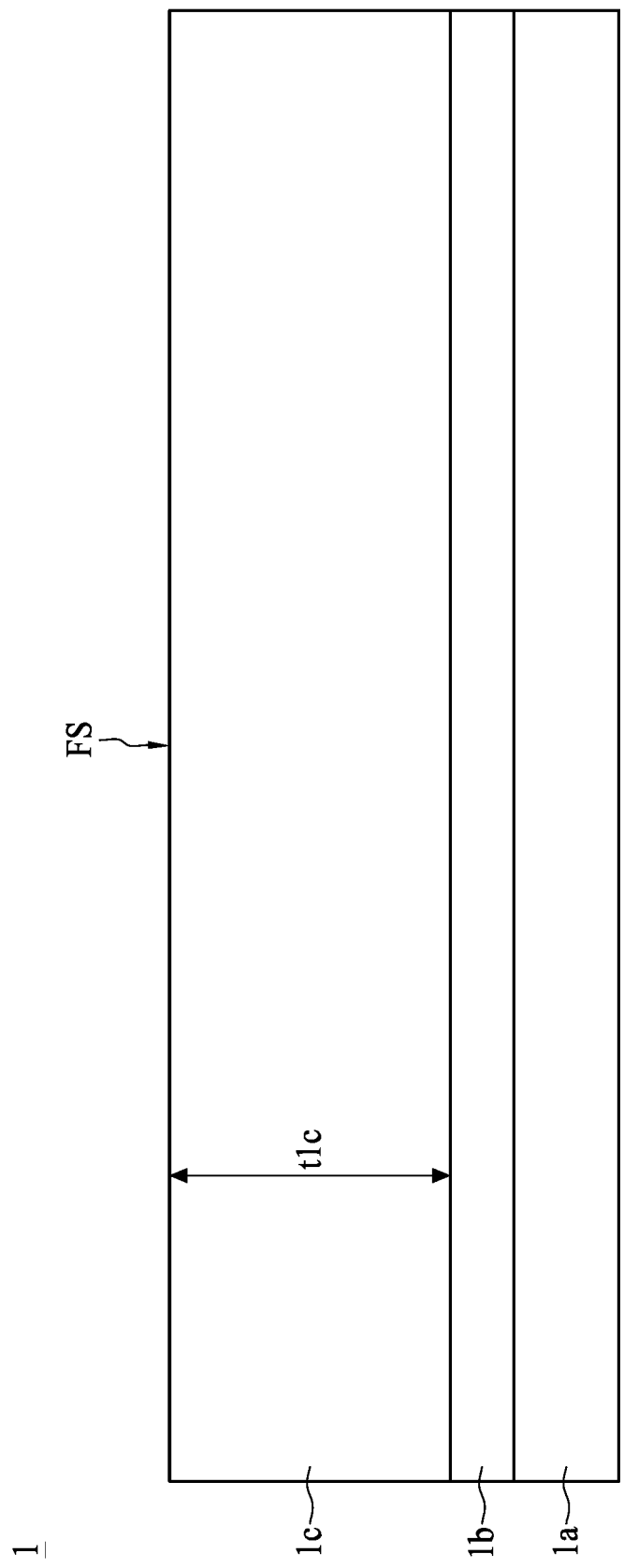
FIG. 3A to FIG. 3Z are cross sectional views of a photo sensing device during intermediate stages of manufacturing operations, according to some embodiments of the present disclosure.

FIG. 3A is a cross sectional view of a photo sensing device during intermediate stages of manufacturing operations, according to some embodiments of the present disclosure. A substrate 1 is provided. In some embodiments, the substrate 1 is an silicon-on-insulator (SOI) substrate, wherein the substrate 1 includes a silicon base layer 1a, an insulation layer 1b over the silicon base layer 1a, and a surface layer 1c over the insulation layer 1b. In some embodiments, the insulation layer 1b can be a buried oxide (BOX) layer. The surface layer 1c may include intrinsic silicon or silicon, and the substrate 1 has a first side FS at an exposed surface of the surface layer 1c.

Figure 3B:
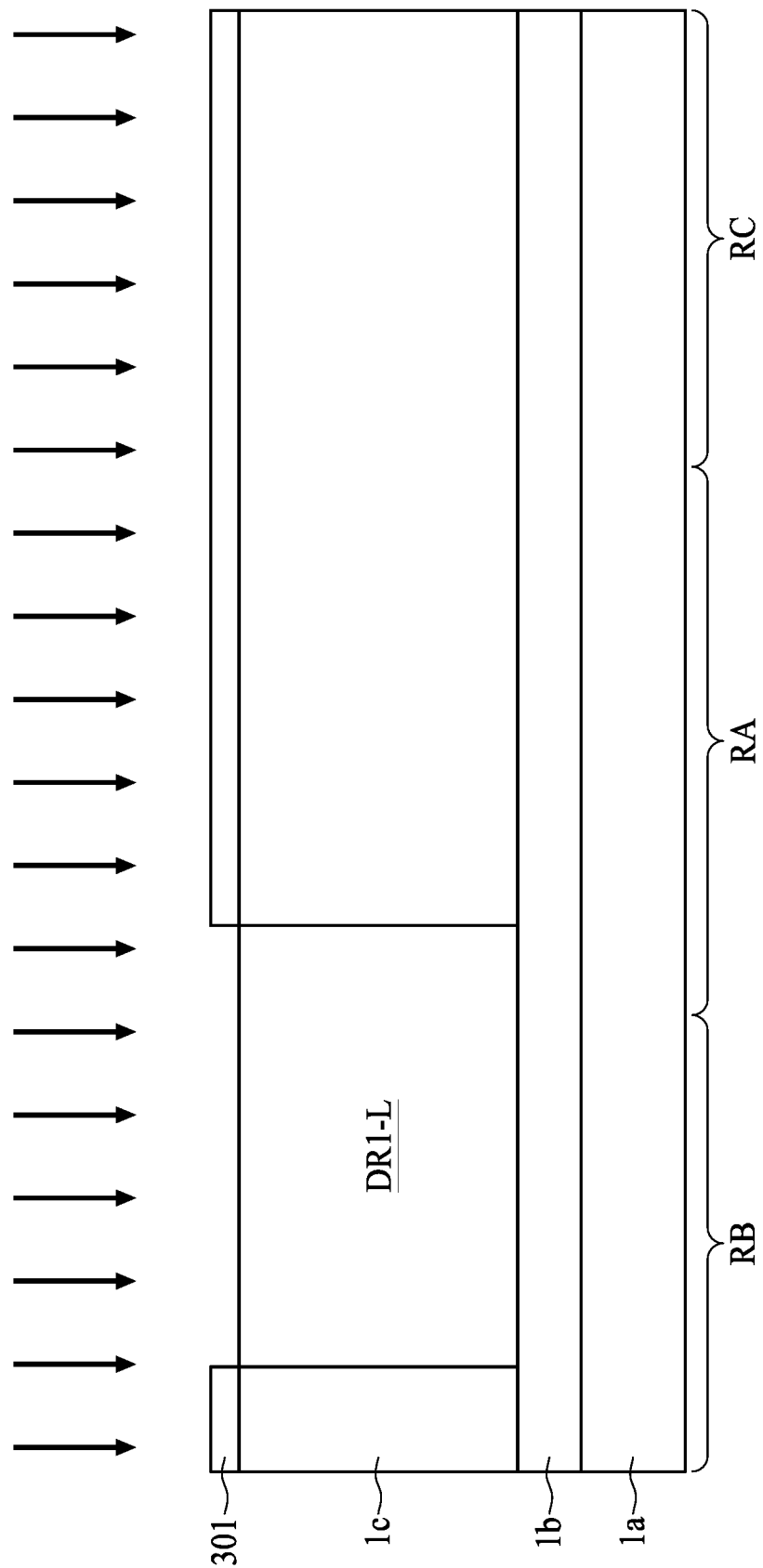

FIG. 3B is a cross sectional view of a photo sensing device during intermediate stages of manufacturing operations, according to some embodiments of the present disclosure. Referring to FIG. 3B, a first mask 301 is formed over the first side FS of the substrate 1 and then patterned. An implantation operation of implanting a first conductivity type dopant (for example, p-type) in the second region RB is performed in order to form a lightly doped region DR1-L. In some of the embodiments, a portion of the lightly doped region DR1-L is also formed in the first region RA at a location proximal to the second region RB. In some of the embodiments, a depth of the lightly doped region DR1-L is substantially identical with a thickness t1c of the surface layer 1c. The first mask 301 is removed after the implantation.

Figure 3C:
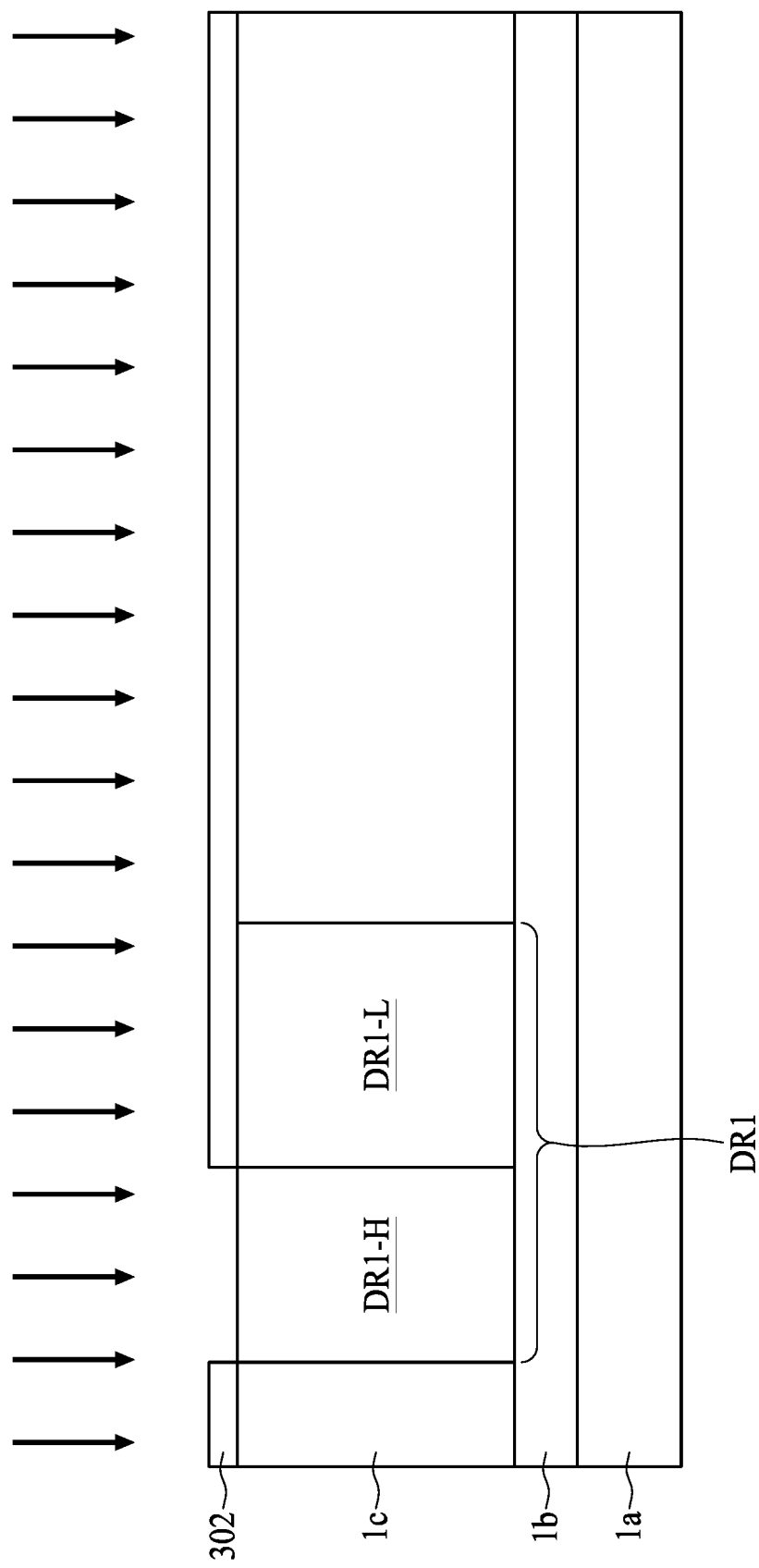

FIG. 3C is a cross sectional view of a photo sensing device during intermediate stages of manufacturing operations, according to some embodiments of the present disclosure. Referring to FIG. 3C, a second mask 302 is formed above the surface layer 1c and then patterned to expose a portion of a top surface of the lightly doped region DR1-L. An implantation operation of implanting the first conductivity type dopant (for example, p-type) is performed in a portion of the lightly doped region DR1-L in order to form a heavily doped region DR1-H having a higher concentration of the first conductivity type dopant than the lightly doped region DR1-L. Herein the heavily doped region DR1-H and the lightly doped region DR1-L are collectively referred to as the first doped region DR1. The second mask 302 is removed after the implantation.

FIG. 3D is a cross sectional view of a photo sensing device during intermediate stages of manufacturing operations, according to some embodiments of the present disclosure. Referring to FIG. 3D, a third mask 303 is formed over the first side FS of the substrate 1 and then patterned. An implantation operation of implanting a second conductivity type dopant (for example, n-type) in the third region RC is performed in order to form a lightly doped region DR2-L. In some of the embodiments, a portion of the lightly doped region DR2-1, is also formed in the first region RA at a location proximal to the third region RC. In some of the embodiments, a depth of the lightly doped region DR2-1, is substantially identical with a thickness t1c of the surface layer 1c. The third mask 303 is removed after the implantation.

Figure 3E:
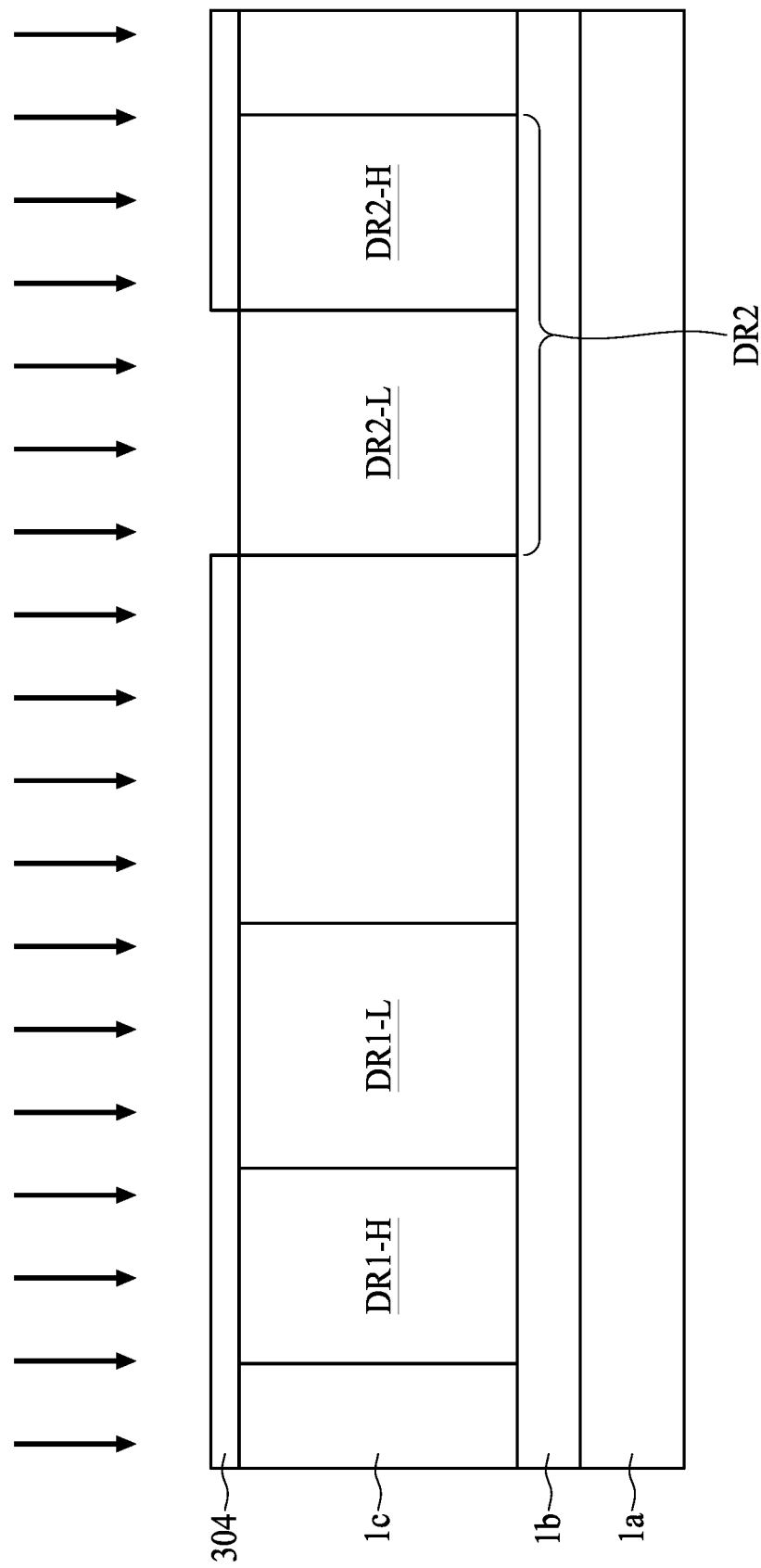

FIG. 3E is a cross sectional view of a photo sensing device during intermediate stages of manufacturing operations, according to some embodiments of the present disclosure. Referring to FIG. 3E, a fourth mask 304 is formed above the surface layer 1c and patterned to expose a portion of a top surface of the lightly doped region DR2-L. An implantation operation of implanting the second conductivity type dopant (for example, n-type) is performed in a portion of the lightly doped region DR2-L in order to form a heavily doped region DR2-H having a higher concentration of the second conductivity type dopant than the lightly doped region DR2-L. Herein the heavily doped region DR2-H and the lightly doped region DR2-L are collectively referred to as the second doped region DR2. The fourth mask 304 is removed after the implantation. In some embodiments, n-type dopant implantation (for example, the operations in FIG. 3D or FIG. 3E) can be followed by a thermal activation operation. For example, the thermal activation can be performed right after forming the lightly doped region DR2-L and/or the heavily doped region DR2-H by the n-type implantation.

Figure 3F:
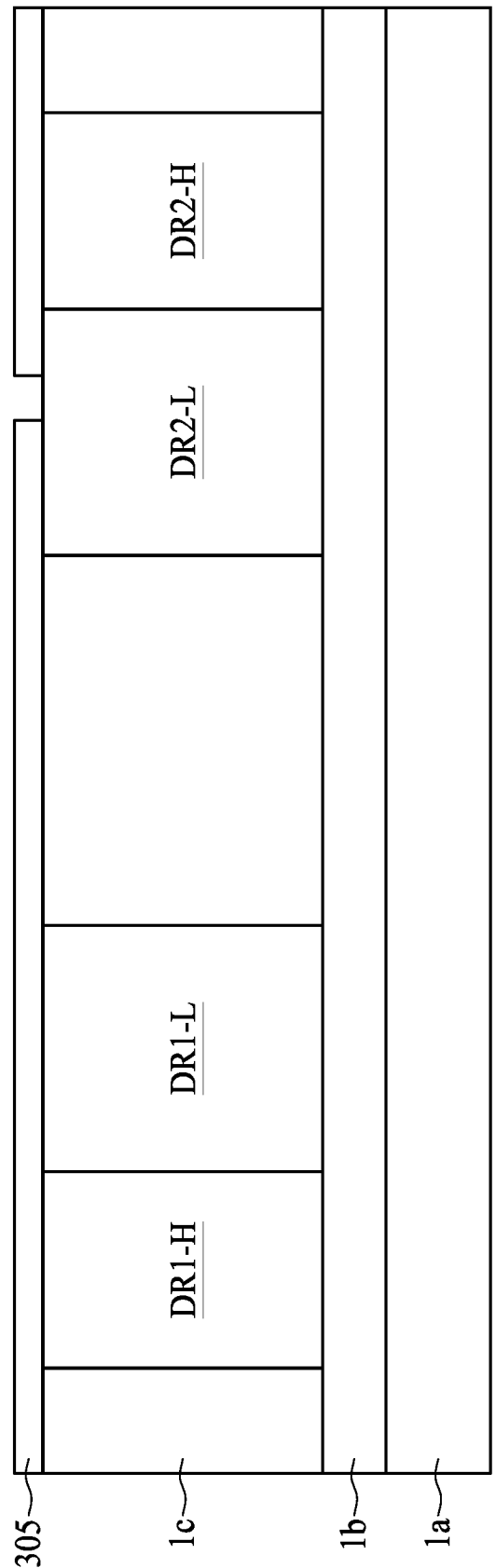
Figure 3G:
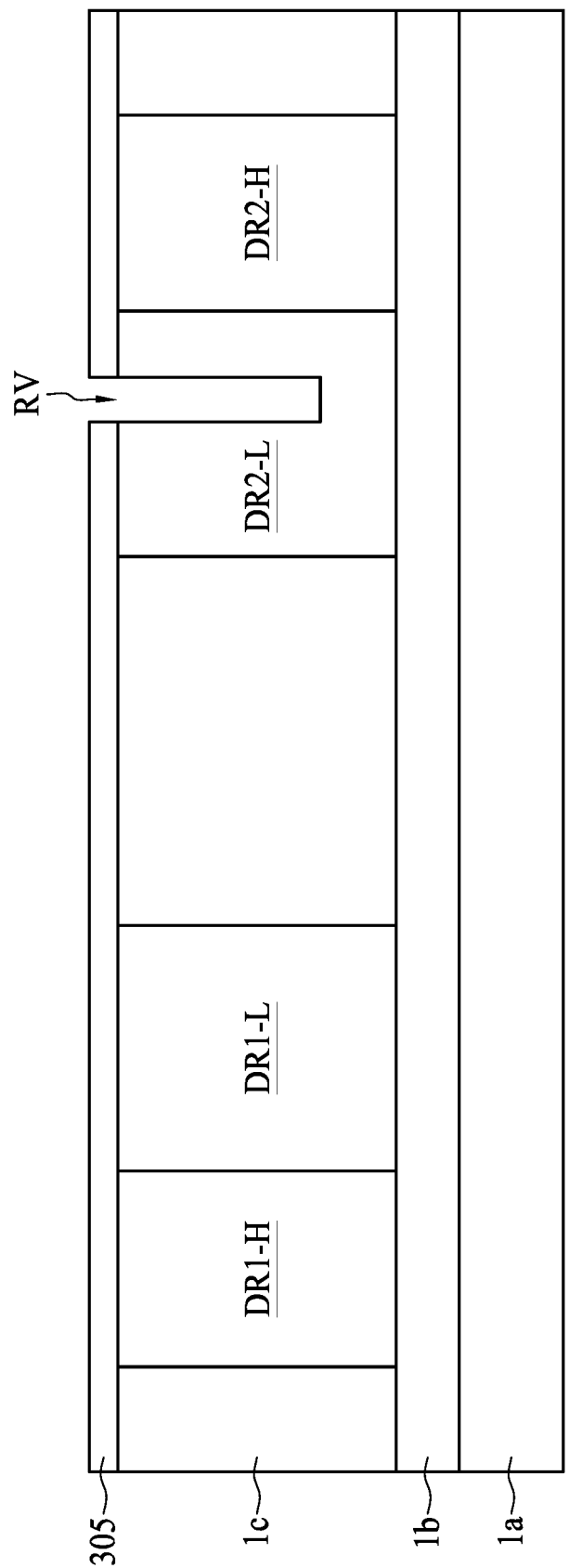
Figure 3H:
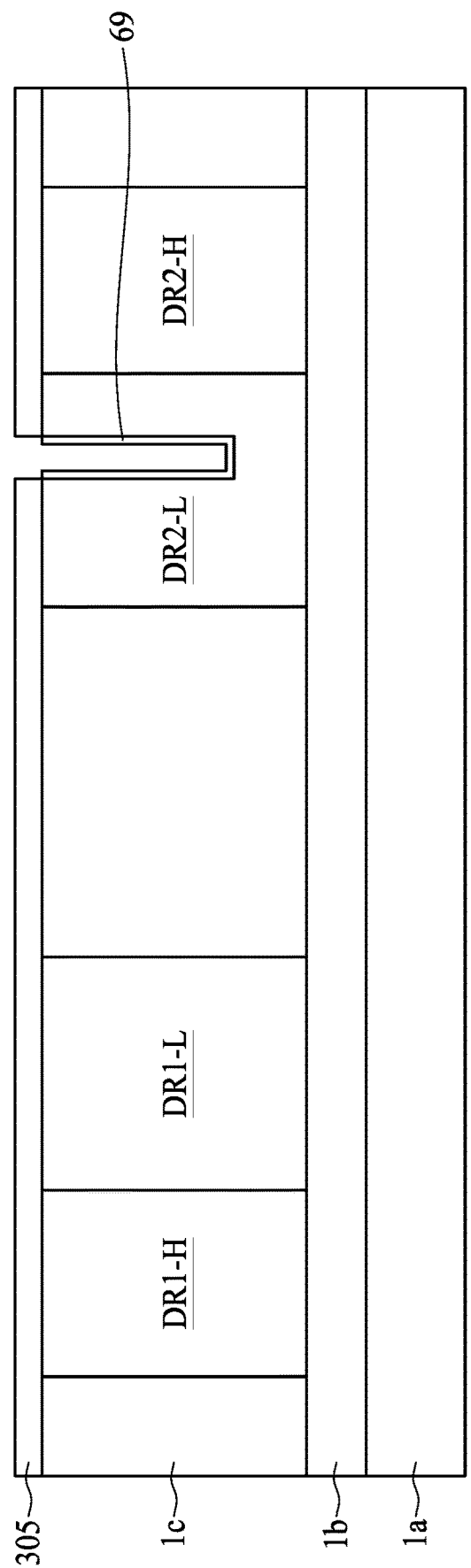
Figure 3I:
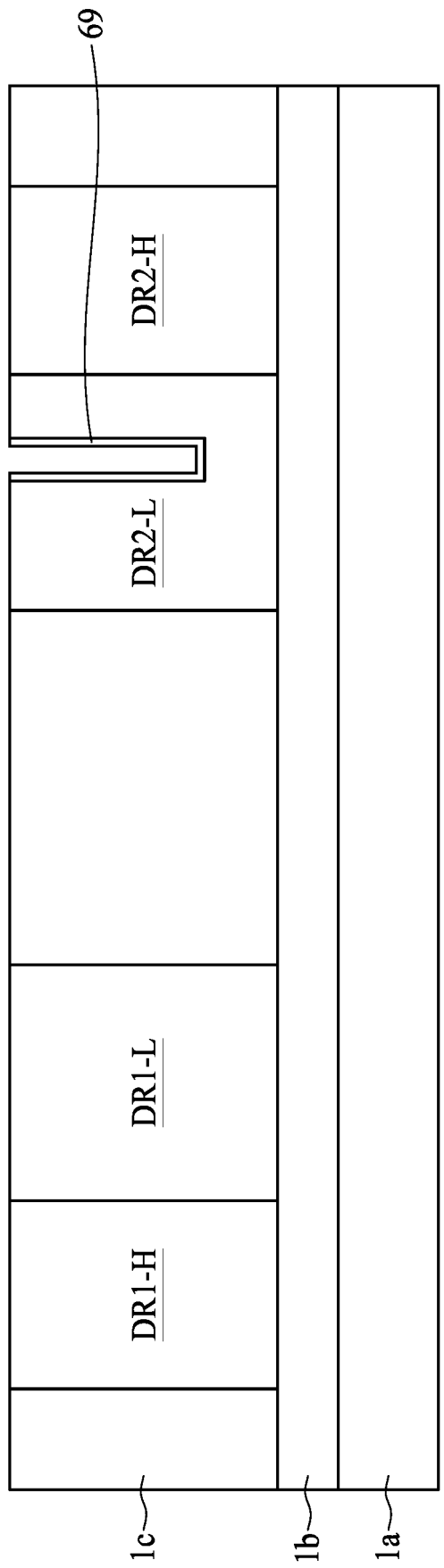

FIG. 3F to FIG. 3I are cross sectional views of a photo sensing device during intermediate stages of manufacturing operations, according to some embodiments of the present disclosure. Referring to FIG. 3F, a fifth mask 305 is formed above the surface layer 1c and patterned to expose a portion of a top surface of the lightly doped region DR2-L. Referring to FIG. 3G, an etching operation is performed to form a trench RV. A bottom surface of the trench RV is above a top surface of the insulation layer 1b of the substrate 1. Referring to FIG. 3H, a diffusion barrier layer 69 is formed on the exposed surface (which may include inner sidewall and/or bottom surface) of the trench RV. The diffusion barrier layer 69 may include silicon nitride, nitrided oxide, or other material that can be utilized as buffer layer that can alleviate dopant diffusion. In some embodiments, an exposed surface (such as an inner sidewall facing inward) of the diffusion barrier layer 69 is smoother than the exposed surface of the trench RV (as shown in FIG. 3G). Referring to FIG. 3I, the fifth mask 305 is removed after forming the diffusion barrier layer 69.

Figure 3J:
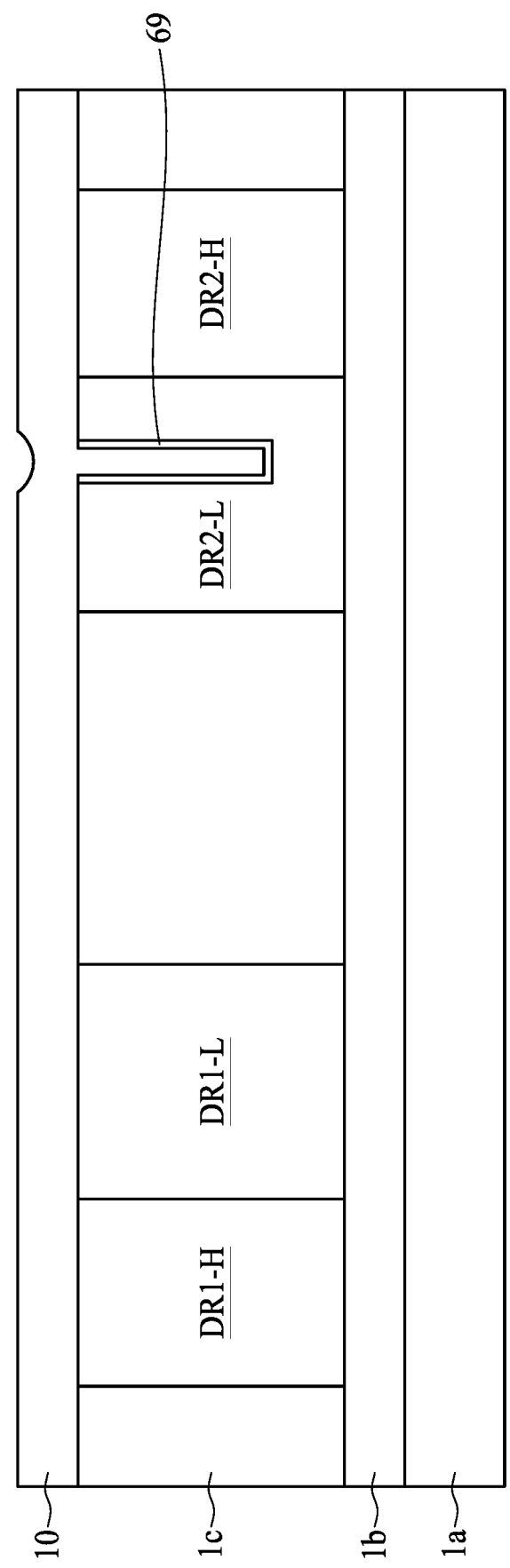
Figure 3K:
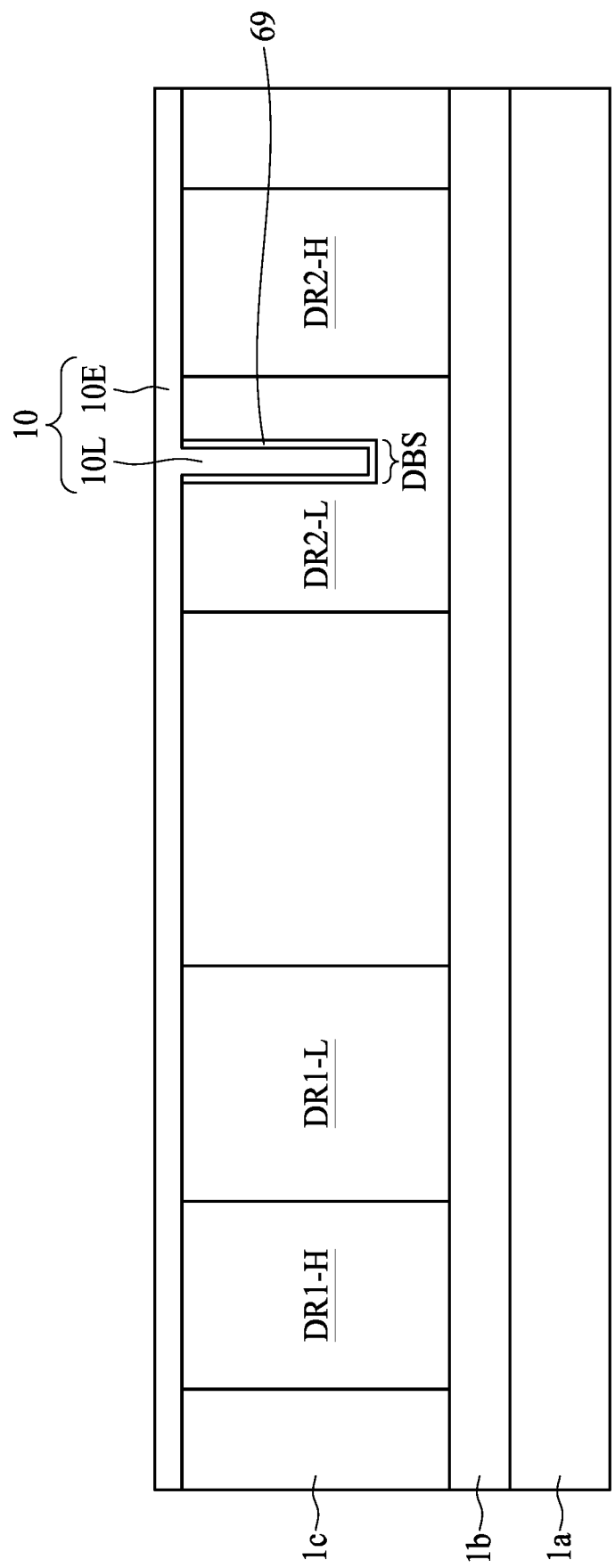

FIG. 3J to FIG. 3K are cross sectional views of a photo sensing device during intermediate stages of manufacturing operations, according to some embodiments of the present disclosure. Referring to FIG. 3J, a dielectric layer 10 is filled in the trench RV. In some embodiments, the dielectric layer 10 may include silicon oxide ($SiO_2$) or silicon nitride (SiN). The dielectric layer 10 may further include an upper portion 10E covering the first side FS of the substrate 1. In some embodiments, a top surface of the upper portion 10E may be non-uniform, for example, having recessed area over the trench RV. Optionally, a pad oxide layer (not shown in FIG. 3I or FIG. 3J) can be formed over the diffusion barrier layer 69 and/or the first side FS of the substrate 1 when the dielectric layer 10 includes silicon nitride. Referring to FIG. 3K, a planarization operation, such as chemical-mechanical planarization (CMP) operation is over the top surface of the upper portion 10E of the dielectric layer 10. The lower portion 10L of the dielectric layer 10 formed in the trench RV and the diffusion barrier layer 69 are collectively referred to as diffusion barrier structure DBS.

Figure 3L:
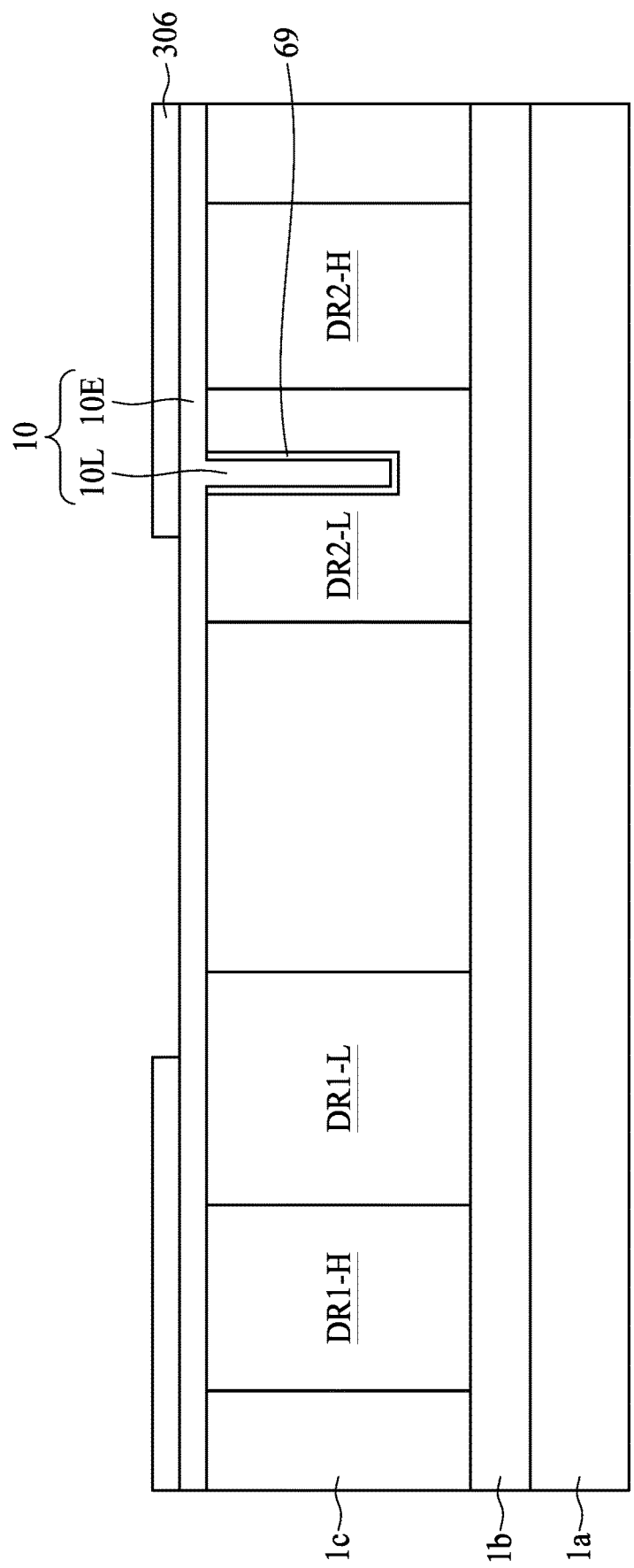
Figure 3M:
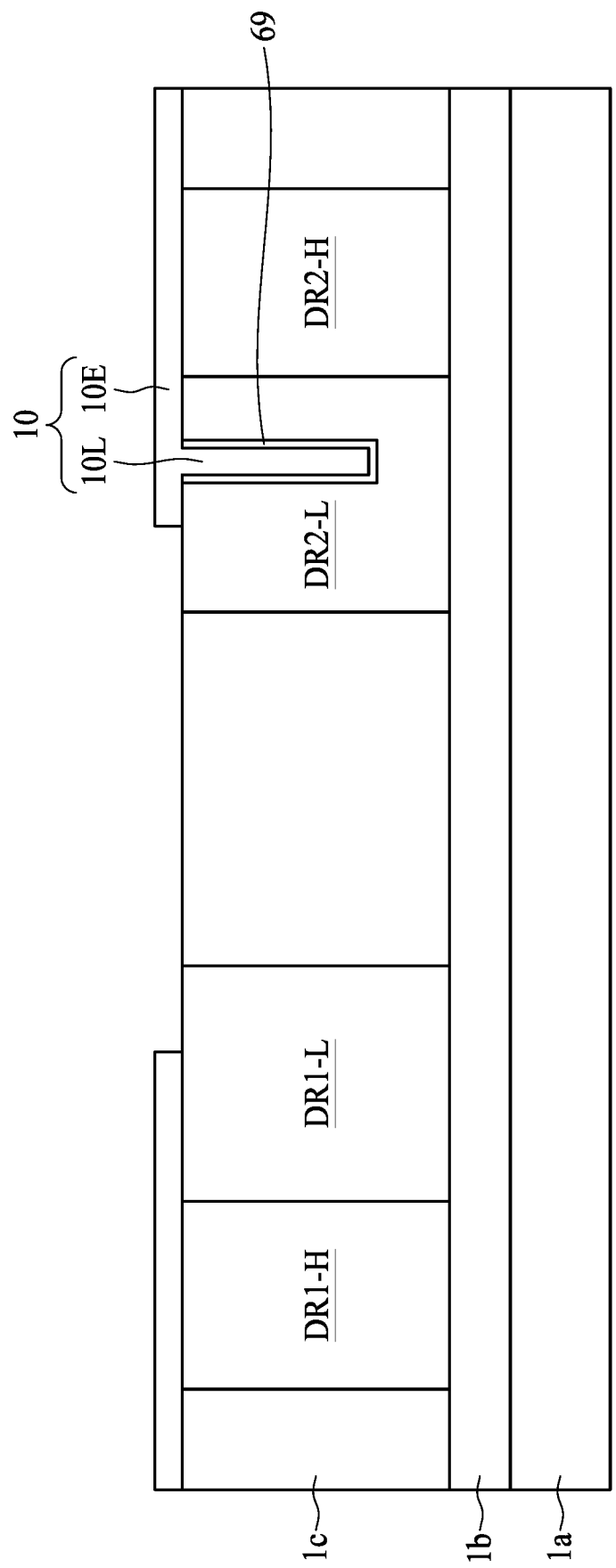

FIG. 3L to FIG. 3M are cross sectional views of a photo sensing device during intermediate stages of manufacturing operations, according to some embodiments of the present disclosure. Referring to FIG. 3L, a sixth mask 306 is formed and patterned above the dielectric layer 10. A portion of a top surface of the upper portion 10E of the dielectric layer 10 is exposed from the sixth mask 306. Referring to FIG. 3M, the upper portion 10E of the dielectric layer 10 is etched to expose a portion of the surface layer 1c, which may include a top surface of the surface layer 1c in the first region RA, a top surface of a portion of the lightly doped region DR1-L in the second region RB adjacent to the first region RA, and a top surface of a portion of the lightly doped region DR2-L in the third region RC adjacent to the first region RA. The sixth mask 306 is removed after patterning of the insulation layer 10.

Figure 3N:
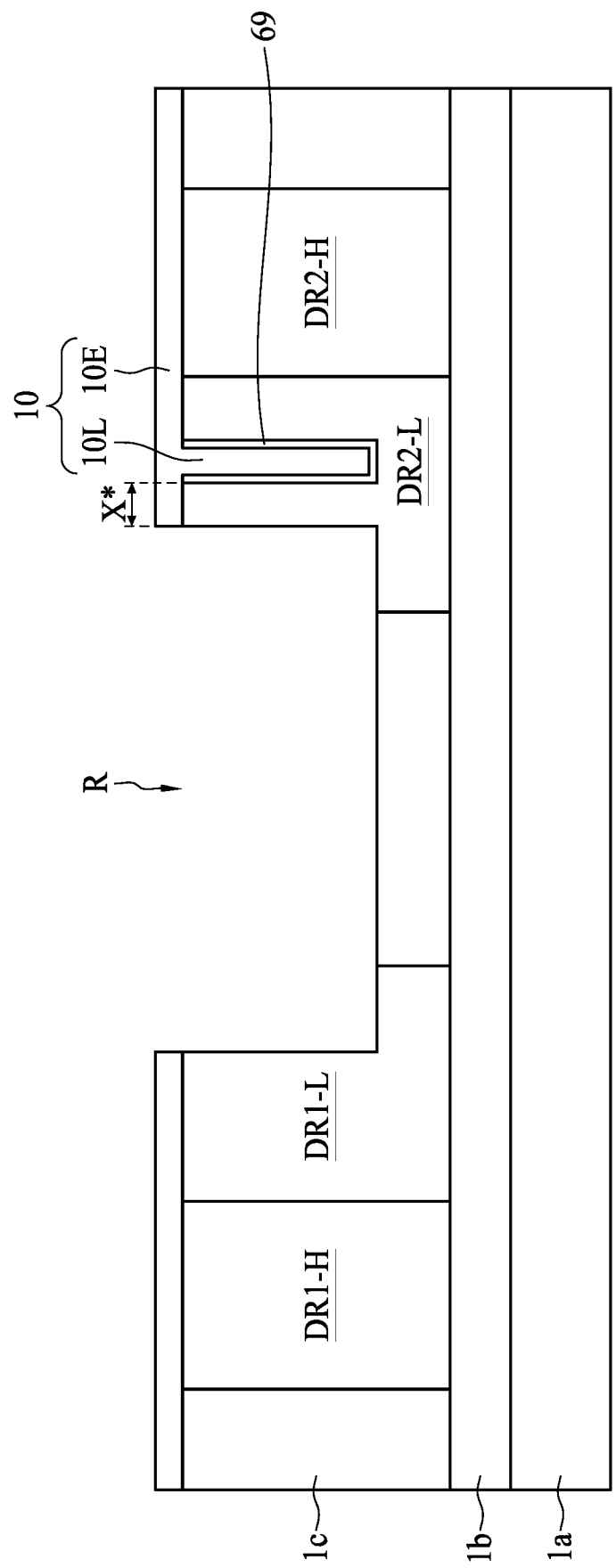
Figure 30:
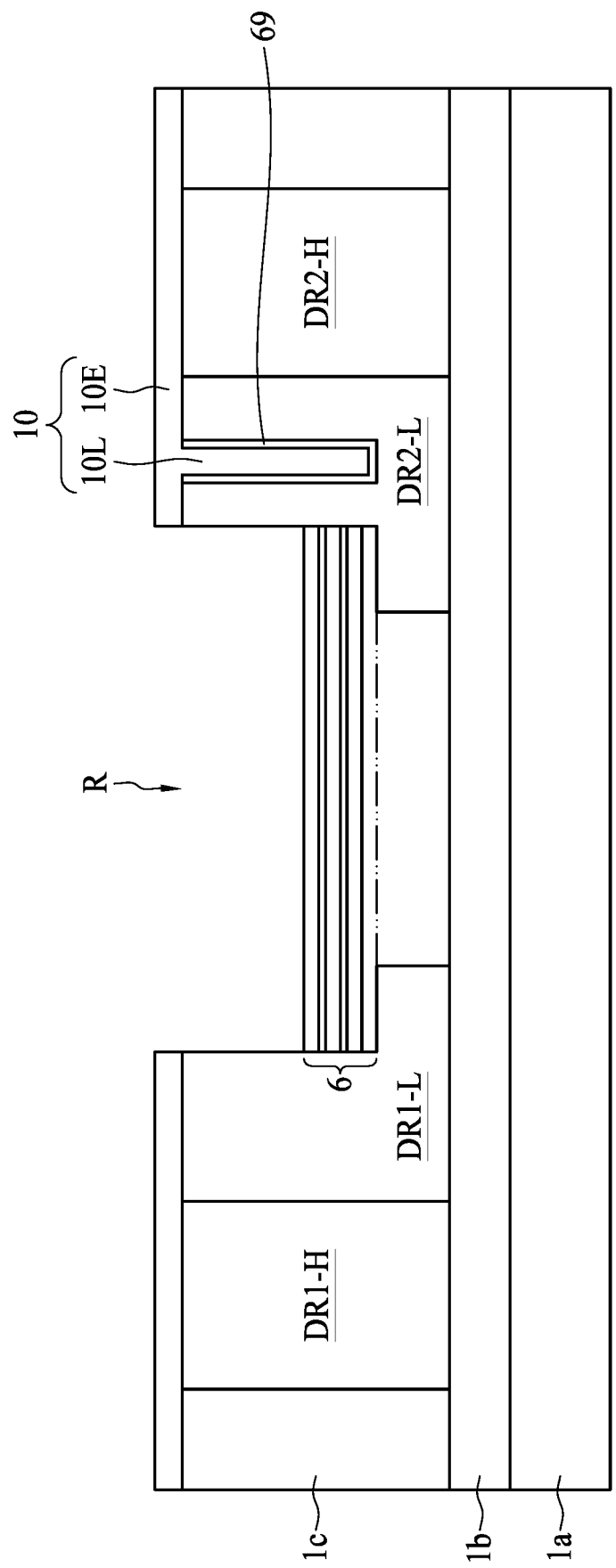

FIG. 3N is a cross sectional view of a photo sensing device during intermediate stages of manufacturing operations, according to some embodiments of the present disclosure. Referring to FIG. 3N, an etch operation is performed through the upper portion 10E of the dielectric layer 10 to remove a portion of the surface layer 1c and form a recess R. It should be noted that a portion of the surface layer 1c in the first region RA is remained between a bottom surface of the recess R and the insulation layer 1b of the substrate 1. A lateral distance X* between a sidewall of the recess R and the diffusion barrier structure DBS is in a range from about 20 nm to about 100 nm, wherein the criticality of the range was discussed in FIG. 1. Optionally, an exposed surface of the recess R can be smoothed by performing one or more cycles of oxygen thermal annealing the substrate 1 to form a sacrificial oxide layer and subsequently remove the sacrificial oxide layer (which can be done by utilizing hydrogen fluoride). The catalyst of aggravating dislocation defects may be alleviated by smoothing the exposed surface of the recess R.

FIG. 3O is a cross sectional view of a photo sensing device during intermediate stages of manufacturing operations, according to some embodiments of the present disclosure. Referring to FIG. 1 and FIG. 3O, a superlattice stack 6 is formed in the recess R. In some embodiments, the superlattice stack 6 is formed by selective epitaxial growth (SEG) technique. The superlattice stack 6 includes a structure of multiple ultra-thin layers. The superlattice stack 6 at least includes a first semiconductor material and a second material different from the first semiconductor material. In the case of the substrate 1/surface layer 1c include intrinsic silicon and photosensitive member 3 to be formed thereon includes intrinsic germanium, the superlattice stack 6 may include silicon (or intrinsic silicon)-silicon germanium alternate superlattice structure. The details of examples of the superlattice stack 6 can be referred to FIG. 1. For one of the example discussed in FIG. 1, the first first-type layer 6X, the second first-type layer 6Y, and the third first-type layer 6Z can include silicon (or intrinsic silicon), and the first second-type layer 6X*, the second second-type layer 6Y*, and the third second-type layer 6Z* includes silicon germanium.

Furthermore, in order to further improve the transitional adjustment of lattice constant of each ultra-thin layers, each of the second-type layer, which may include $Ge_xSi_{1-x}$, may have different molar concentration of germanium (x). A molar concentration of germanium (x) of a second-type layer is greater than a molar concentration of germanium (x) of another underlying second-type layer. For example, the composition of each layers can be: the first first-type layer 6X includes intrinsic silicon, the first second-type layer 6X* includes $Ge_{0.1}Si_{0.9}$ (where x=0.1), the second first-type layer 6Y includes intrinsic silicon, the second second-type layer 6Y* includes $Ge_{0.75}Si_{0.25}$ (where x=0.75), the third first-type layer 6Z includes intrinsic silicon, and the third second-type layer 6Z* includes $Ge_{0.9}Si_{0.1}$ (where x=0.9). In some embodiments, in order to form the aforesaid configuration, each of the layers can be sequentially formed by selective epitaxial growth. It should be noted that the total number of layers herein is not limited to 6, which may also be less than 6 or greater than 6.

Figure 3P:
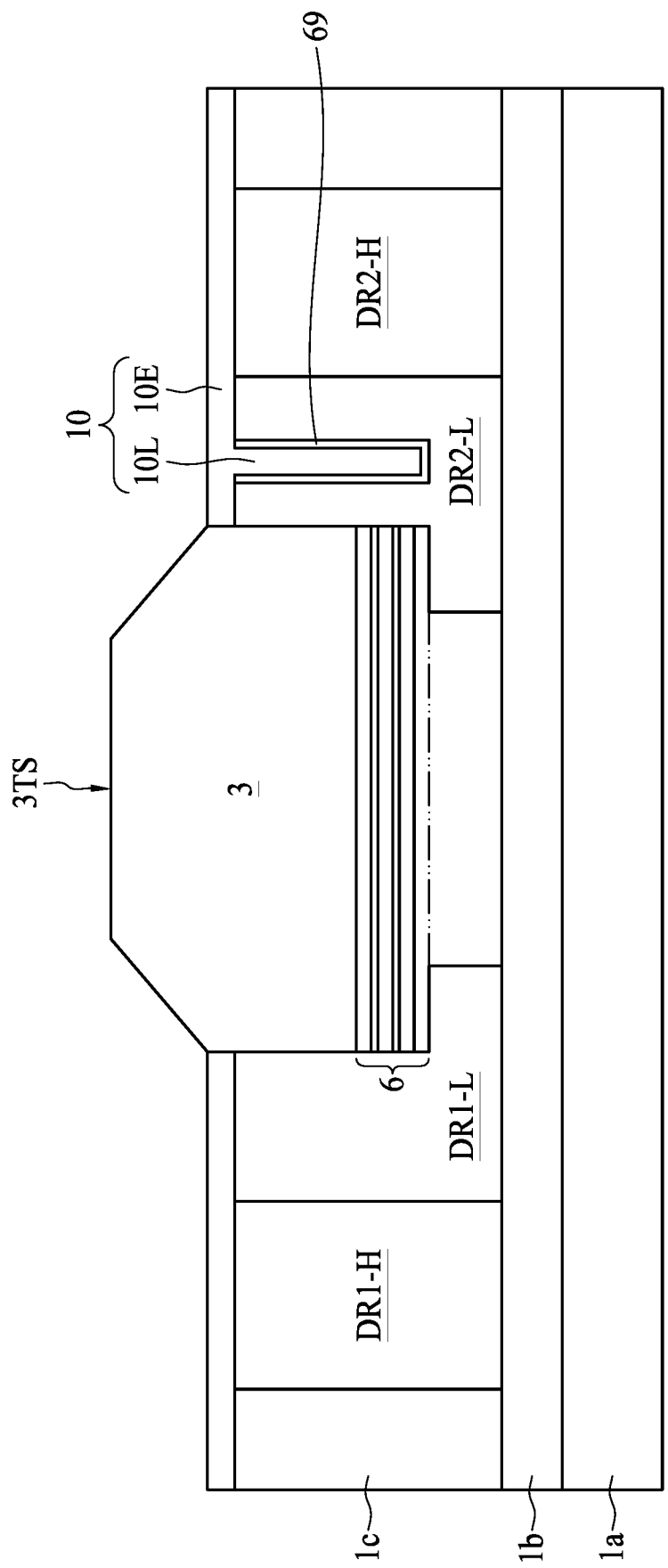

FIG. 3P is a cross sectional view of a photo sensing device during intermediate stages of manufacturing operations, according to some embodiments of the present disclosure. Referring to FIG. 3P, a photosensitive member 3 is formed in the recess R, as the photosensitive member 3 is surrounded by the superlattice stack 6. In sonic embodiments, the photosensitive member 3 is formed by selective epitaxial growth (SEG) technique. In some embodiments, the photosensitive member 3 includes an epitaxial material, for example, intrinsic germanium or germanium. In some embodiments, an upper portion of the photosensitive member 3 protrudes from the recess R and the upper portion 10E of the dielectric layer 10, and may have a facet tapering toward the top. In some alternative embodiments, the insulation layer 10 may also cover the top surface 3TS of the photosensitive member 3. As discussed in FIG. 1, by the configuration of the superlattice stack 6, the lattice dislocation caused by lattice mismatch between the photosensitive member 3 and the substrate 1 may be alleviated.

In some embodiments, during forming the photosensitive member 3 and/or the superlattice stack 6, the substrate 1 may be annealed. In some embodiments, during the aforesaid selective epitaxial growth (SEG) operations, a temperature of the substrate 1 may be elevated to be in a range from about 400° C. to about 700° C. Under an elevated temperature, the issue of dopant diffusion may be aggravated. As previously discussed in FIG. 1, by forming the diffusion barrier structure DBS prior to forming the photosensitive member 3 and the superlattice stack 6, the issue of diffusion may be alleviated.

Figure 3Q:
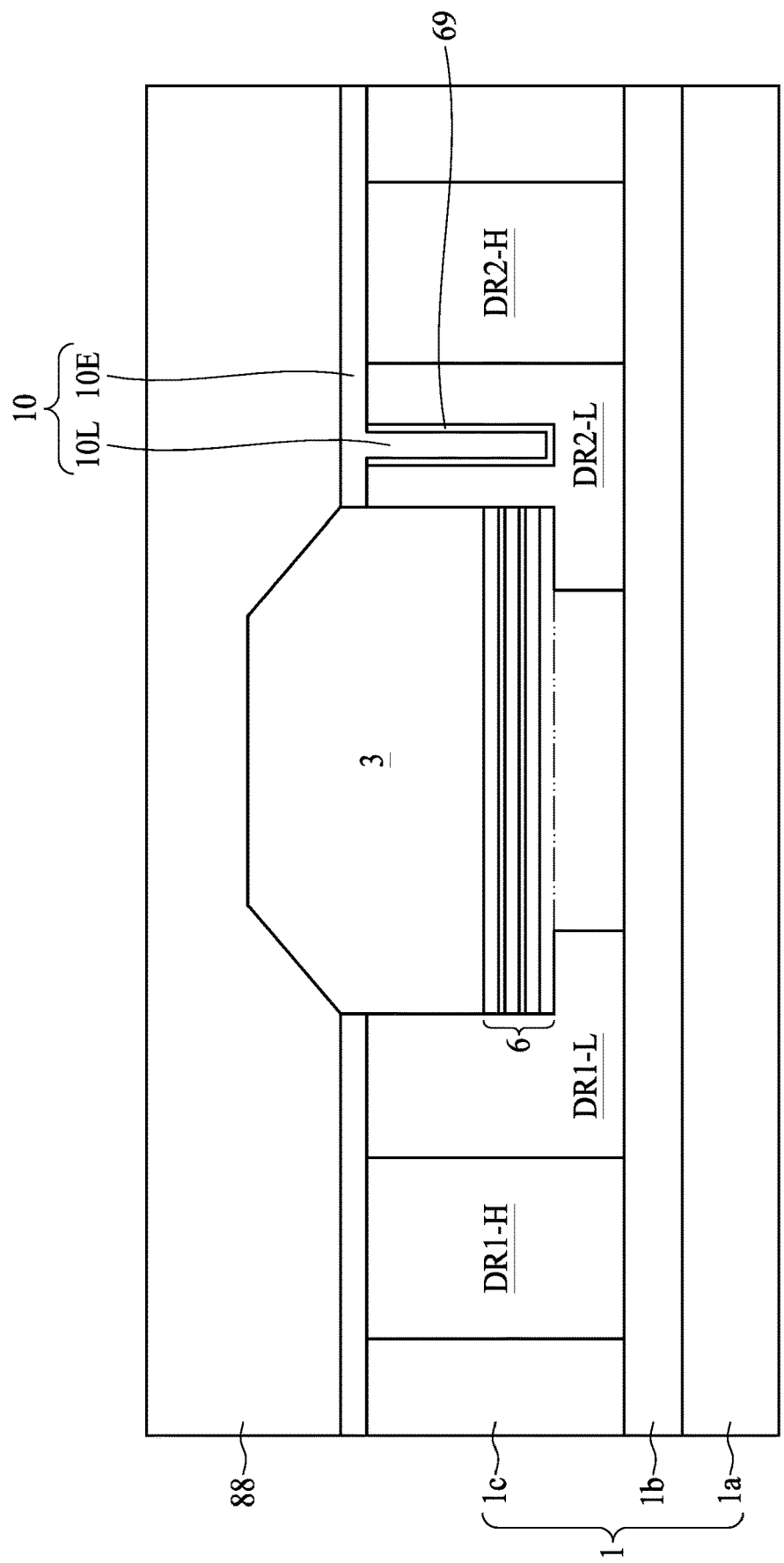
Figure 3R:
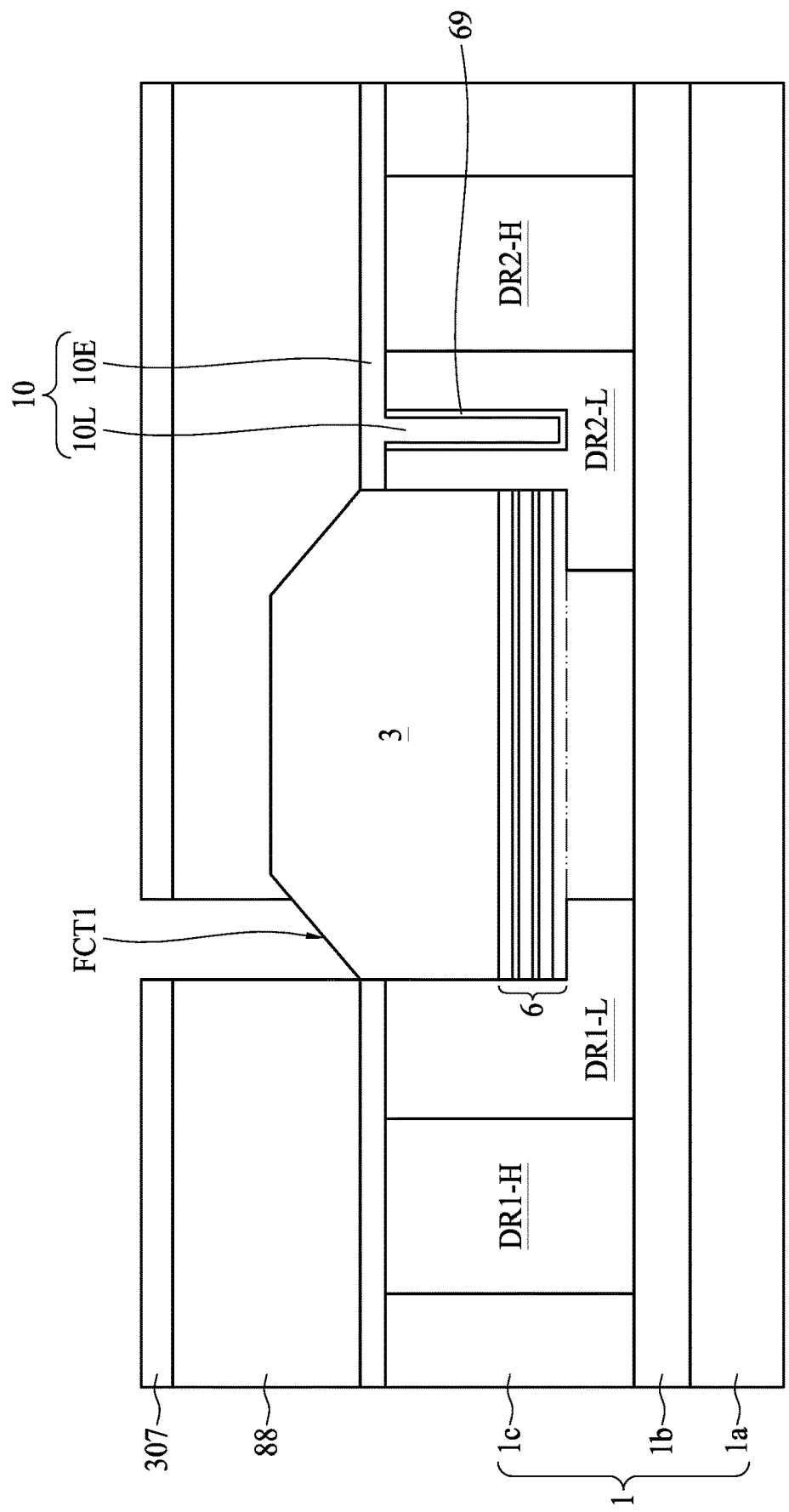

FIG. 3Q and FIG. 3R are cross sectional views of a photo sensing device during intermediate stages of manufacturing operations, according to some embodiments of the present disclosure. Referring to FIG. 3Q, a first sacrificial masking layer 88 is formed over the upper portion 10E of the dielectric layer 10, wherein the first sacrificial masking layer 88 covers the photosensitive member 3. Optionally, a pad oxide layer (not shown in FIG. 3Q) is formed over the upper portion 10E of the dielectric layer 10 prior to forming the first sacrificial masking layer 88. In some embodiments, the first sacrificial masking layer 88 may include oxide, silicon nitride (SiN), or the like. Referring to FIG. 3R, a seventh mask 307 is formed and patterned over the first sacrificial masking layer 88. An etching operation can be performed through the seventh mask 307 to remove a portion of the first sacrificial masking layer 88 to expose a portion of a top surface of the photosensitive member 3. In some embodiments, a portion of a first facet FCT1 of the photosensitive member 3 adjacent/proximal to the second region RB is exposed.

Figure 3S:
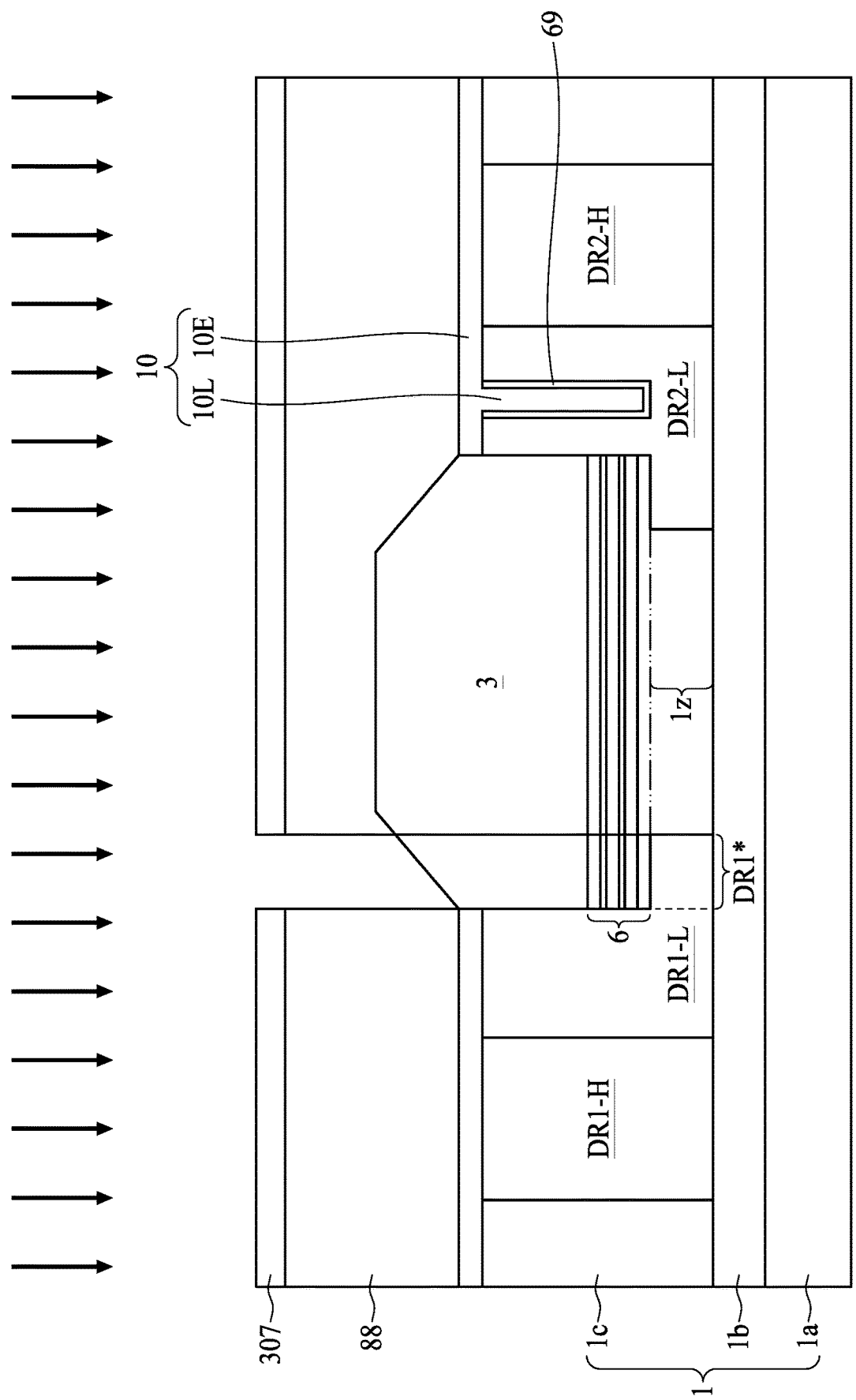

FIG. 3S is a cross sectional view of a photo sensing device during intermediate stages of manufacturing operations, according to some embodiments of the present disclosure. Referring to FIG. 3S, an implant operation of doping first conductivity type dopant is performed through the seventh mask 307. A portion of the superlattice stack 6 adjacent to the second region RB and a portion of the photosensitive member 3 proximal to the second region RB are doped with the first conductivity type dopant (such as p-type dopant), wherein these doped portions are collectively referred to as the third doped region DR1*. A portion of the first portion 1z of the surface layer 1c adjacent to the second region RB may also be doped with the first conductivity type dopant. In some embodiments, a concentration of the first conductivity type dopant in the third doped region DR1* is lower than concentration of the first conductivity type dopant in the heavily doped region DR1-H.

Figure 3T:
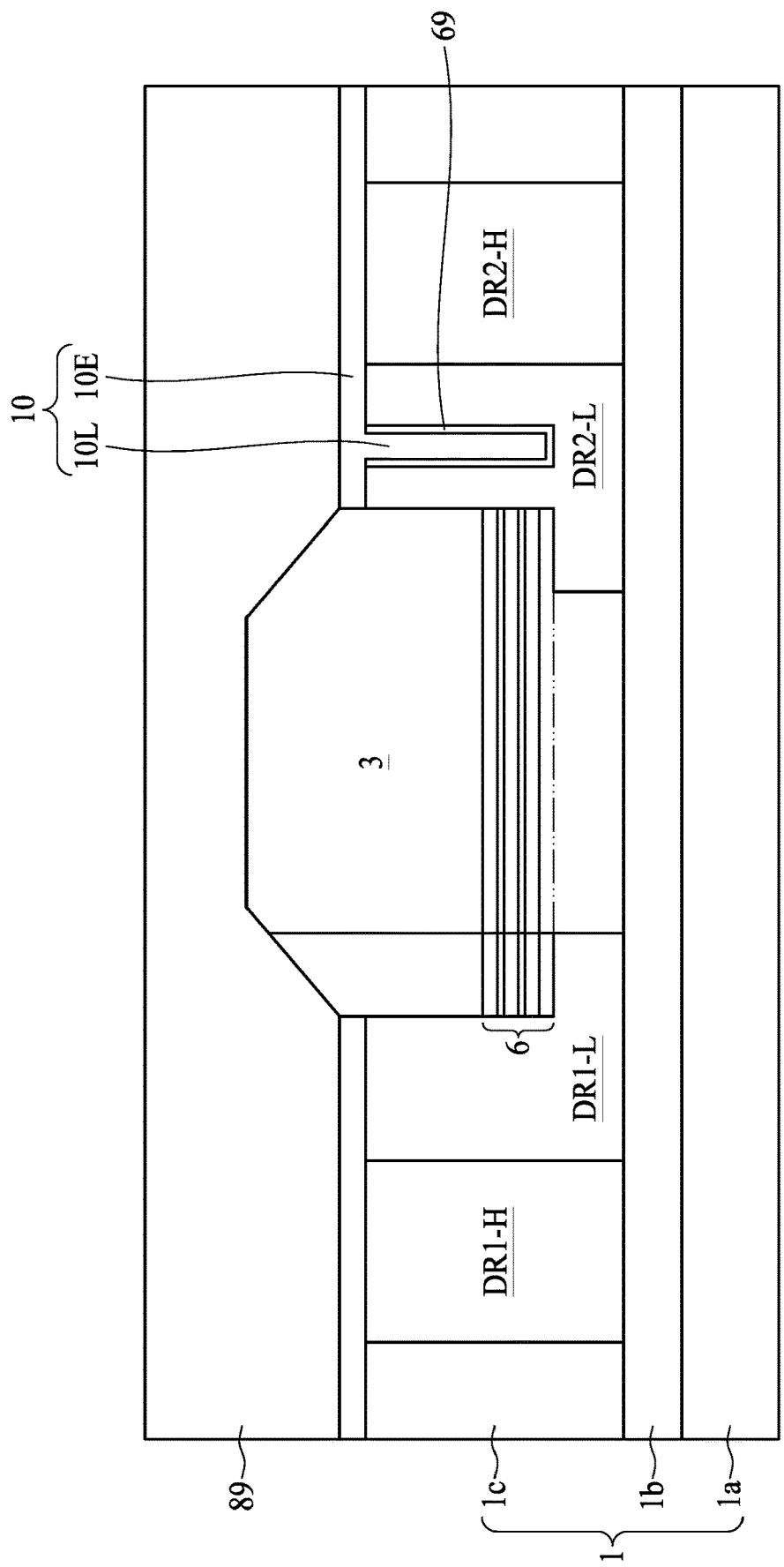
Figure 3U:
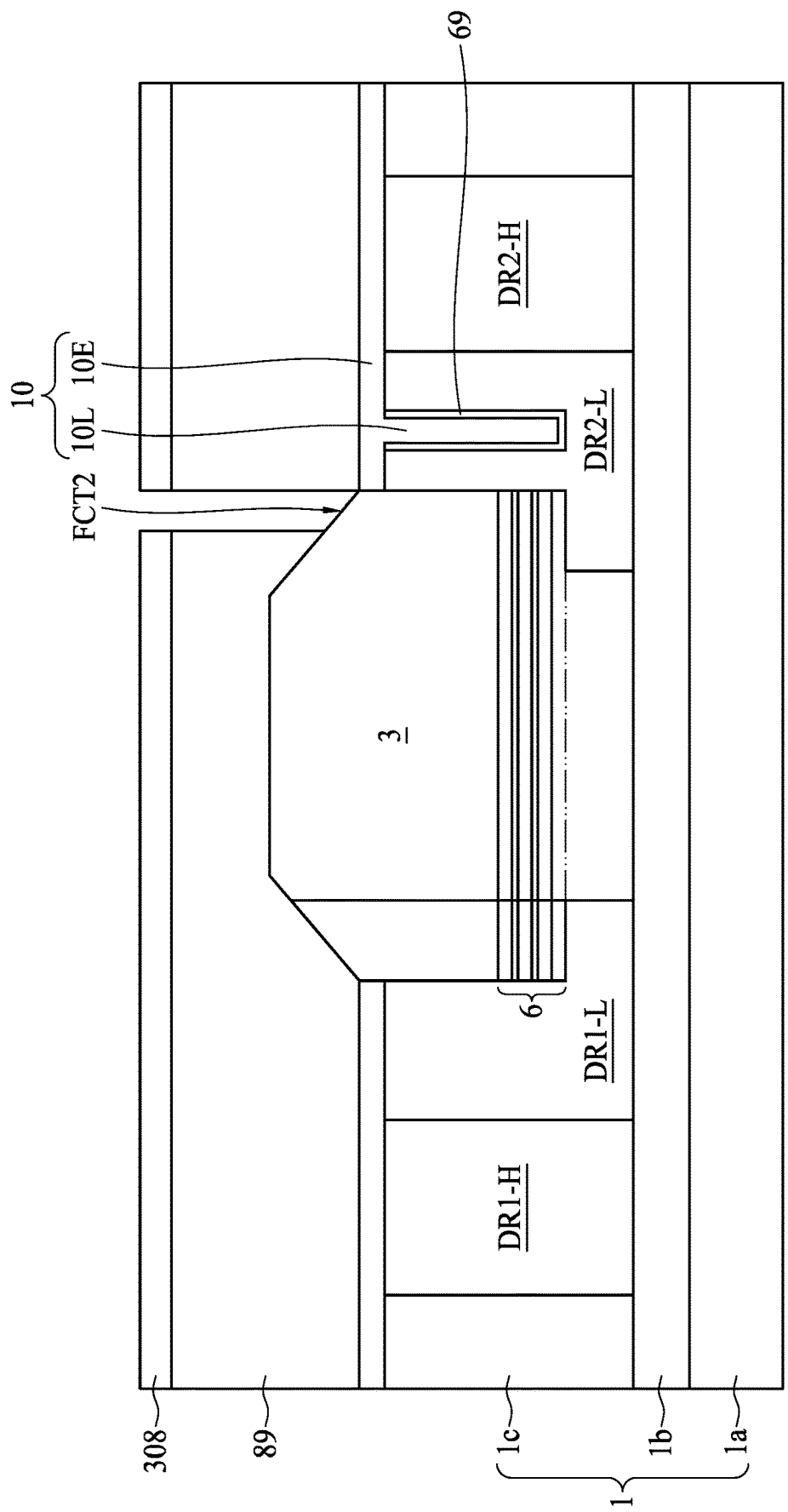
Figure 3V:
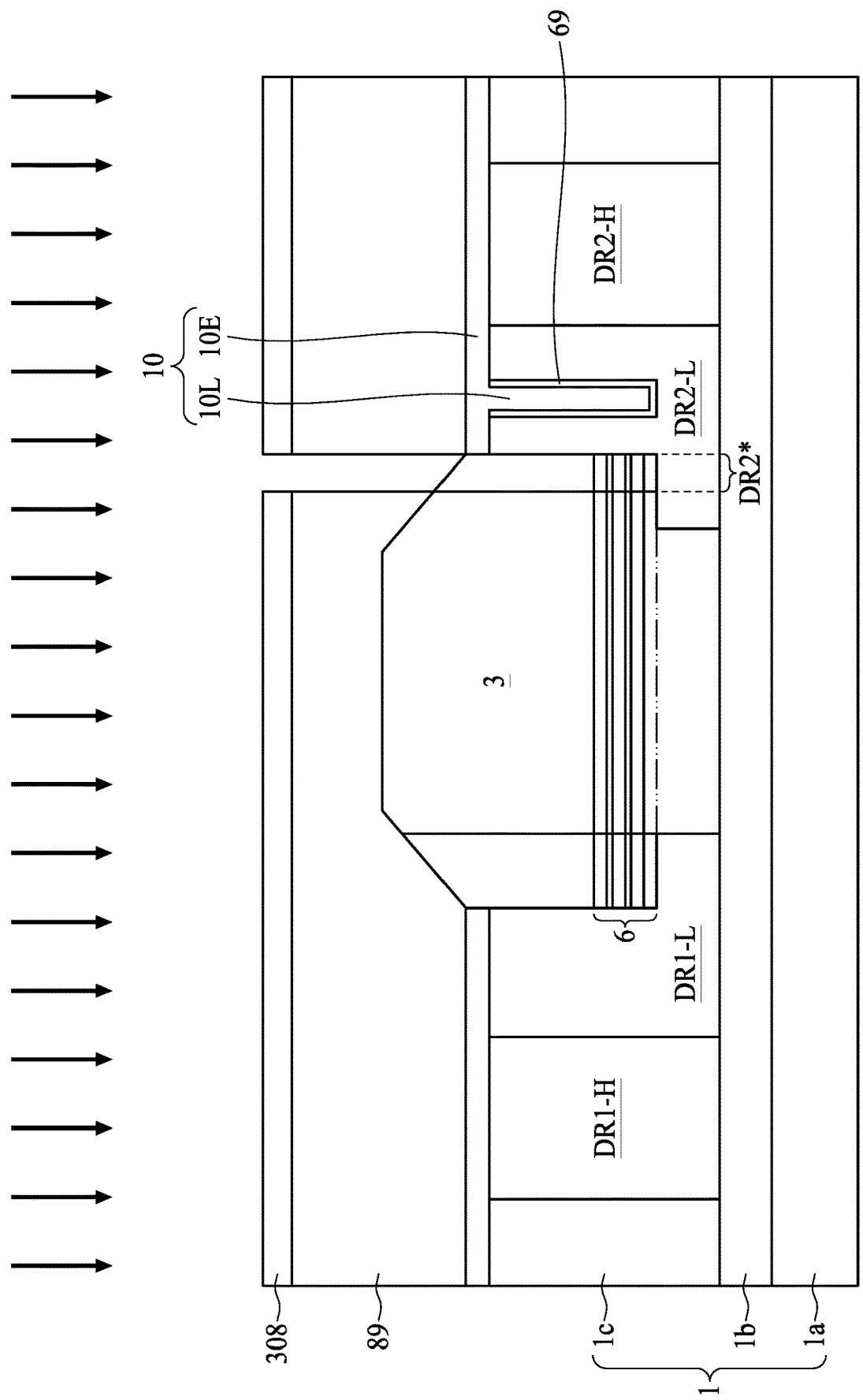

The operations discussed in FIG. 3T to FIG. 3V can optionally be performed. FIG. 3T to FIG. 3V are cross sectional views of a photo sensing device during intermediate stages of manufacturing operations, according to some embodiments of the present disclosure. The seventh mask 307 is removed after the implant operation. A second sacrificial masking layer 89 is then formed above the upper portion 10E of the dielectric layer 10, wherein the second sacrificial masking layer 89 covers the photosensitive member 3. In some embodiments, the second sacrificial masking layer 89 may include oxide, silicon nitride (SiN), or the like. Optionally, a pad oxide layer (not shown in FIG. 3T) is formed over the dielectric layer 10 prior to forming the second sacrificial masking layer 89. Referring to FIG. 3U, an eighth mask 308 is formed and patterned over the second sacrificial masking layer 89. An etching operation can be performed through the eighth mask 308 to remove a portion of the second sacrificial masking layer 89 to expose a portion of a top surface of the photosensitive member 3. In some embodiments, a portion of a second facet FCT2 of the photosensitive member 3 adjacent/proximal to the third region RC is exposed. Referring to FIG. 3V, an implant operation of doping second conductivity type dopant is performed through the eighth mask 308. A portion of the superlattice stack 6 adjacent to the third region RC and a portion of the photosensitive member 3 proximal to the third region RC are doped with the second conductivity type dopant (such as n-type dopant), wherein these doped portions are collectively referred to as the fourth doped region DR2*. A portion of the first portion 1z of the surface layer 1c adjacent to the third region RC may also be doped with the second conductivity type dopant. In some embodiments, a concentration of the second conductivity type dopant in the fourth doped region DR2* is lower than concentration of the second conductivity type dopant in the heavily doped region DR2-H. In some embodiments, n-type dopant implantation can be followed by a thermal activation operation. For example, the thermal activation can be performed right after forming the fourth doped region DR2* by performing n-type implantation in the photosensitive member 3.

By performing the doping operations discussed in FIG. 3Q to FIG. 3V for forming the third doped region DR1* and/or the fourth doped region DR2* at least in a portion of the photosensitive member 3 and a portion of the superlattice stack 6, the issue of carrier trapping due to band-offset between the semiconductor layer 1c and the photosensitive member 3 can be alleviated and the carrier injection efficiency can be improved. As a result, the speed of detection and signal-converting of the photo sensing device 100 can further be improved.

Figure 3W:
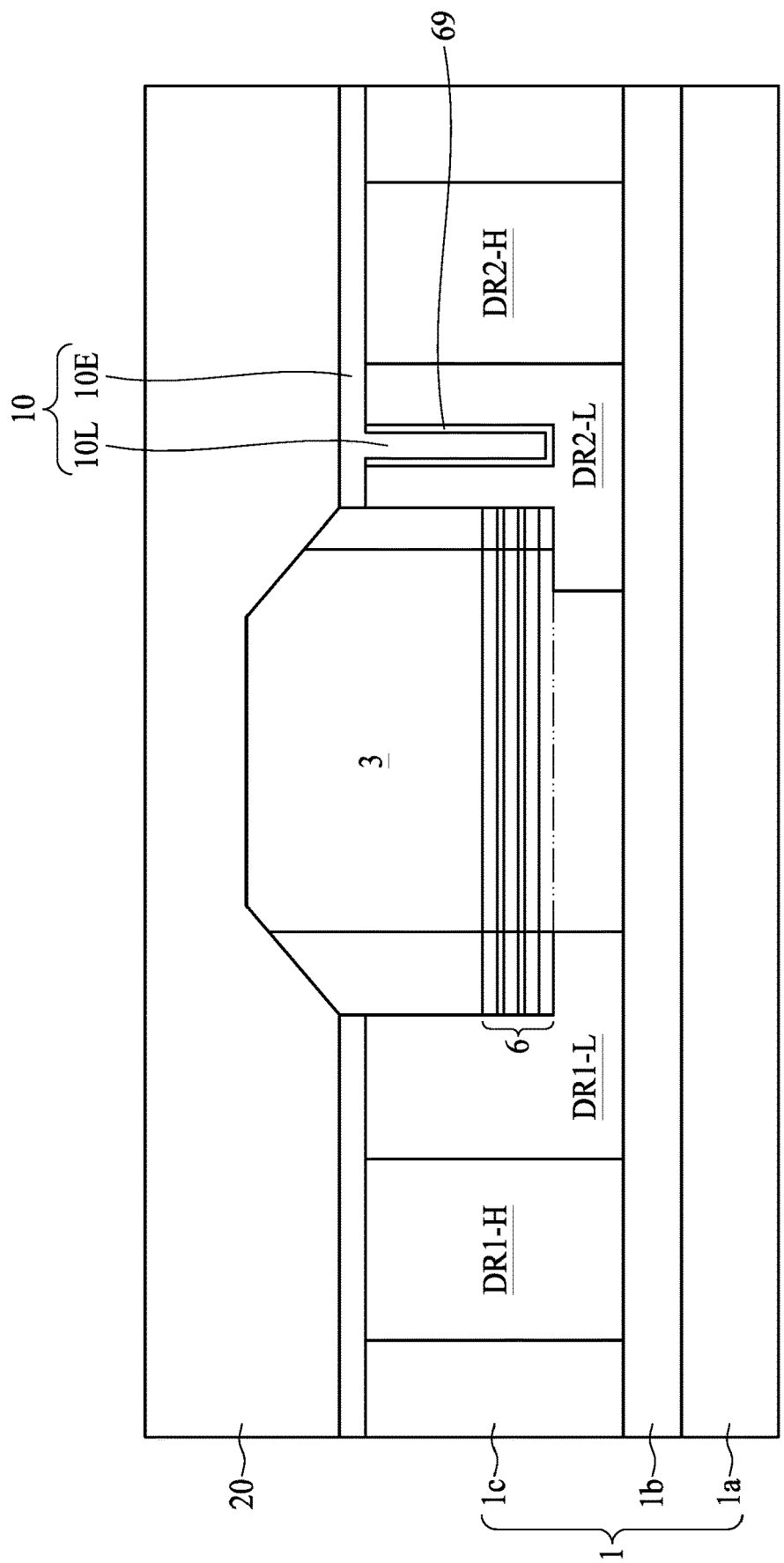

FIG. 3W is a cross sectional view of a photo sensing device during intermediate stages of manufacturing operations, according to some embodiments of the present disclosure. Referring to FIG. 3W, the eighth mask 308 and the second sacrificial masking layer 89 are subsequently removed. A capping layer 20 is then formed above the upper portion 10E of the dielectric layer 10, wherein the capping layer 20 covers the photosensitive member 3. In some embodiments, the capping layer 20 may include oxide, silicon nitride (SiN), or the like. Optionally, a pad oxide layer (not shown in FIG. 3W) is formed over the dielectric layer 10 and the photosensitive member 3 prior to forming the capping layer 20. A chemical mechanical planarization (CMP) operation can be performed on a top surface of the capping layer 20.

Figure 3X:
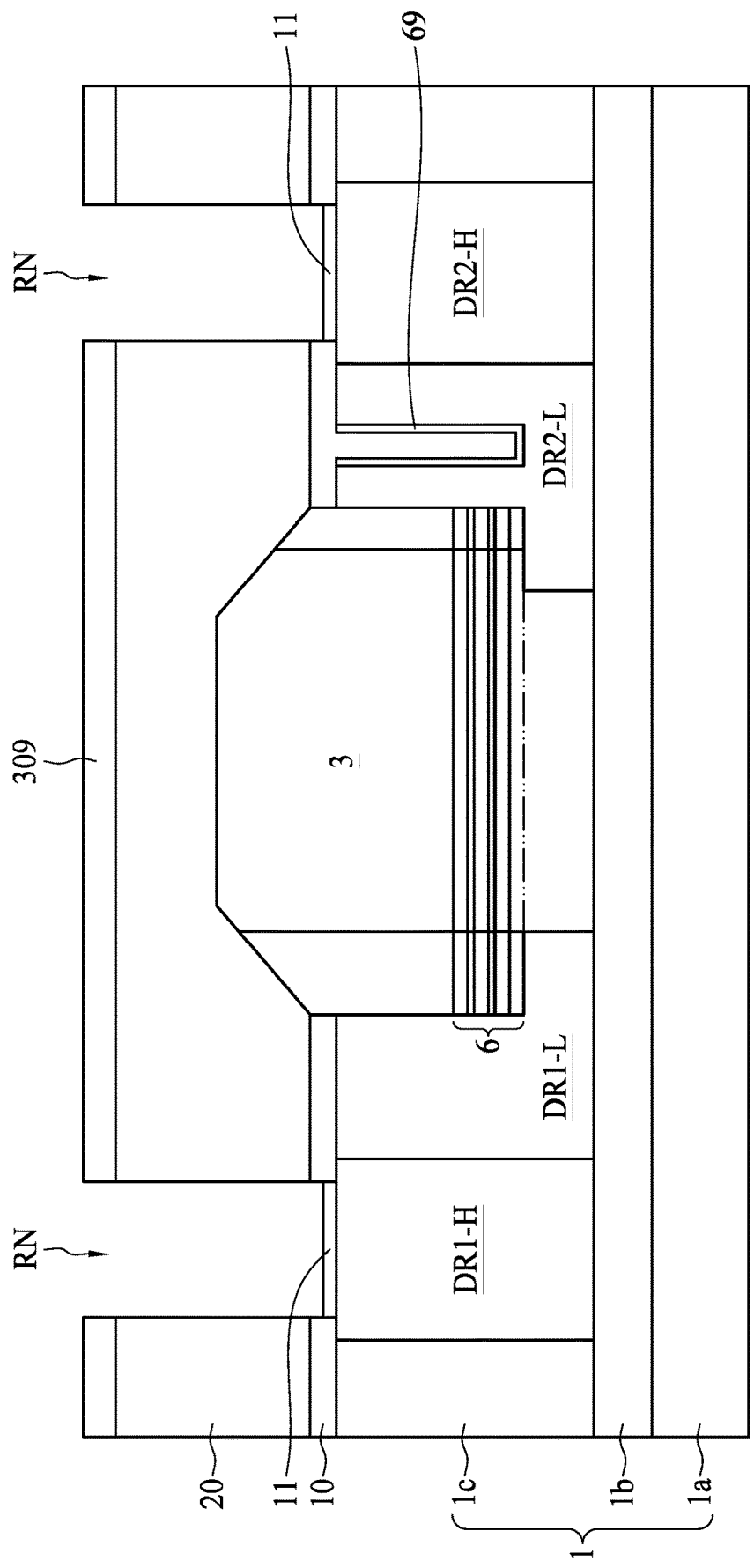

FIG. 3X is a cross sectional view of a photo sensing device during intermediate stages of manufacturing operations, according to some embodiments of the present disclosure. Referring to FIG. 3X, a ninth mask 309 is formed and patterned above the capping layer 20. Some portions of the capping layer 20 and the upper portion 10E of the dielectric layer 10 directly above the heavily doped region DR1-H of the first doped region DR1 and the heavily doped region DR2-H of the second doped region DR2 are removed by using the patterned ninth mask 309. A plurality of recesses RN is formed and a portion of the top surface of the substrate 1 is thereby exposed. Also, referring to FIG. 3X) Silicide layers 11, or other material suitable to be used as contact interface layer, are disposed in the recesses RN and above the heavily doped region DR1-H of the first doped region DR1 and the heavily doped region DR2-H of the second doped region DR2.

Figure 3Y:
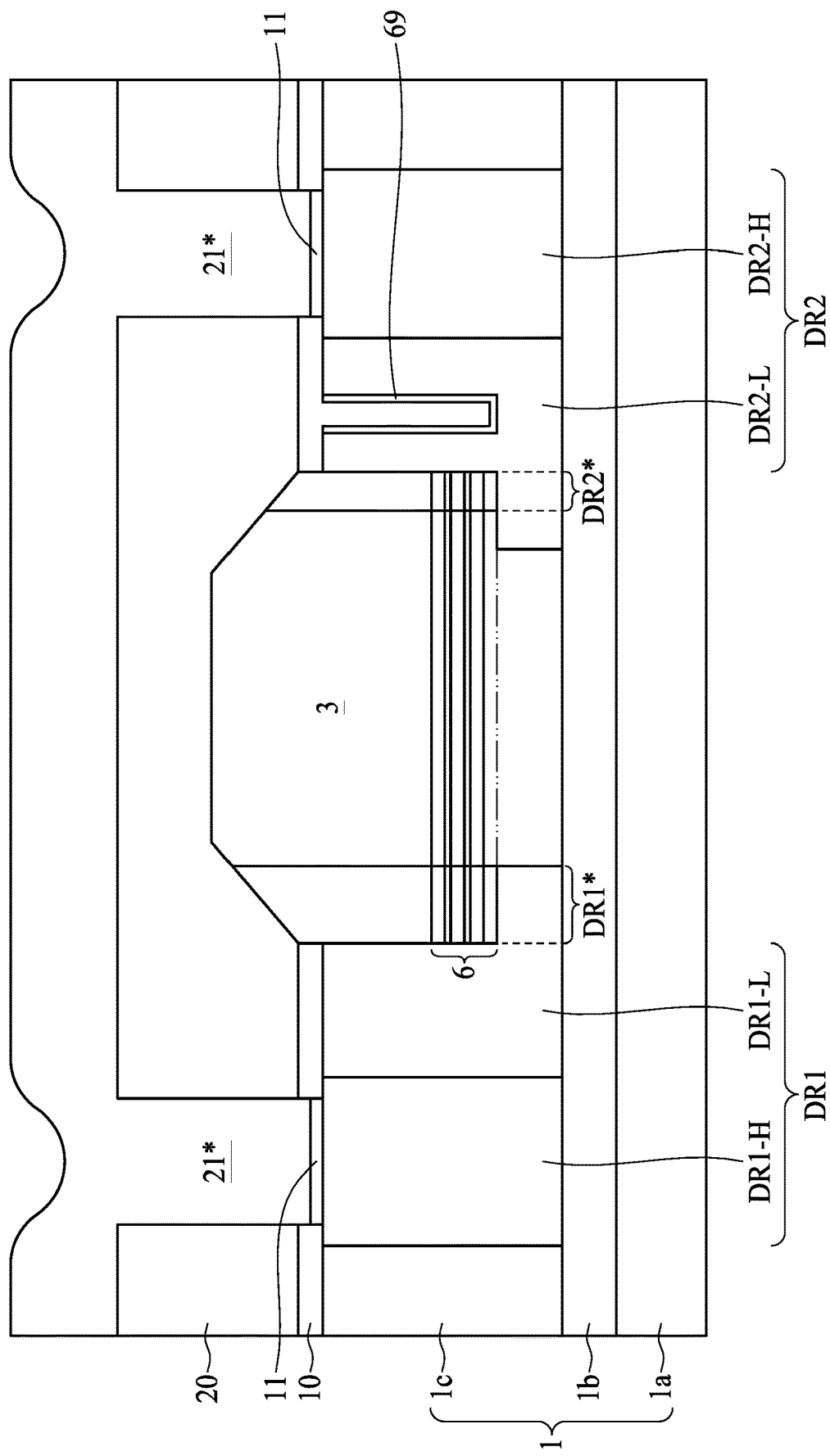

FIG. 3Y is a cross sectional view of a photo sensing device during intermediate stages of manufacturing operations, according to some embodiments of the present disclosure. Referring to FIG. 3Y, a conductive material 21* is formed in the recesses RN and is configured to be in direct contact with the silicide layers 11. The conductive material 21* may be metal. In some embodiments, a position of the conductive material 21* directly above the recesses RN may be recessed at a top surface.

Figure 3Z:
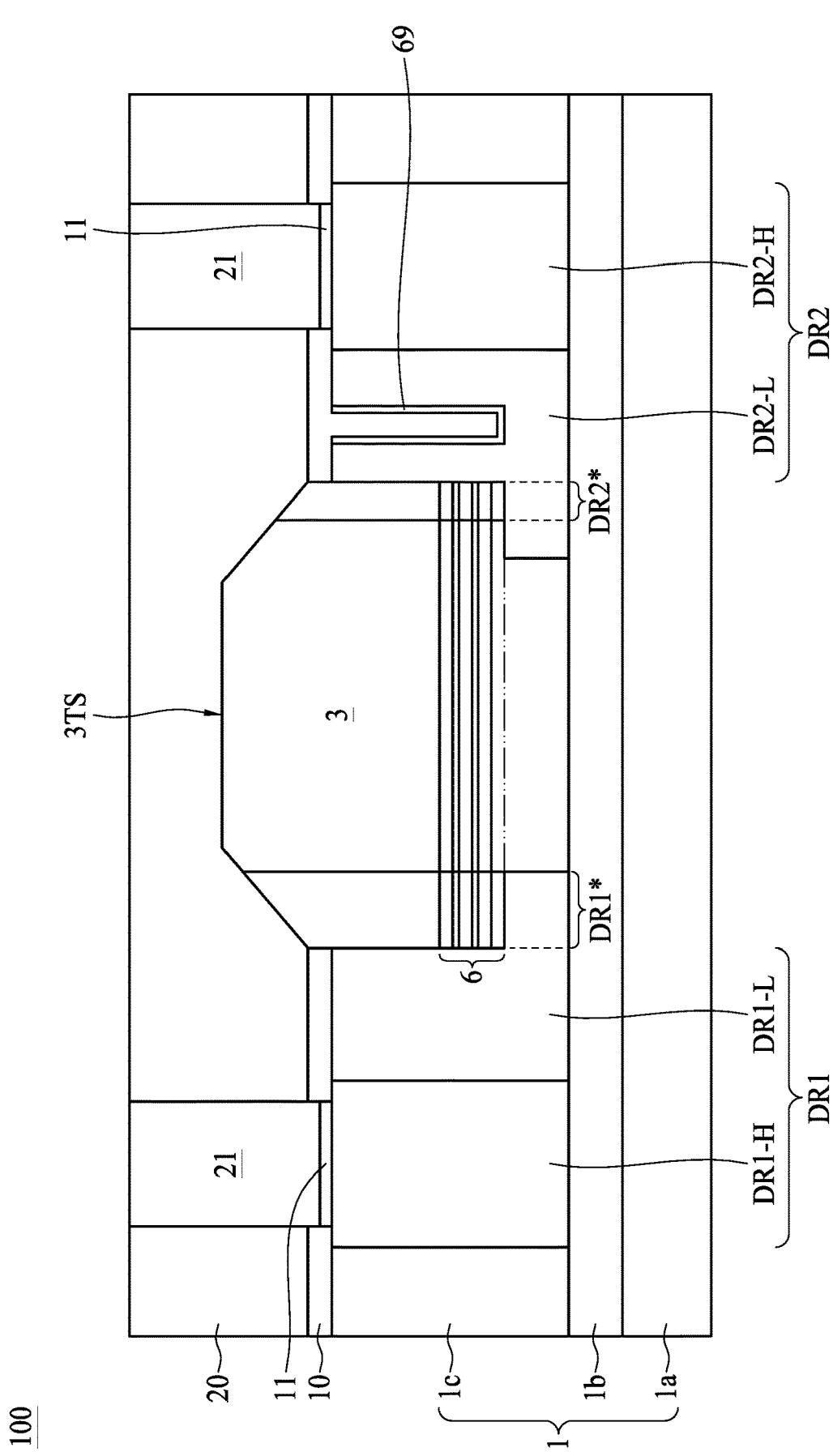

FIG. 3Z is a cross sectional view of a photo sensing device during intermediate stages of manufacturing operations, according to some embodiments of the present disclosure. Referring to FIG. 3Z, a CMP operation can be performed on a top surface of the conductive material 21* to remove a portion of the conductive material 21* above the capping layer 20. Thereby, the conductive contacts 21 are formed.

The present disclosure provides a photo sensing device 100 and a method of fabricating the photo sensing device 100. In order to alleviate the issues caused by lattice mismatch between the photosensitive member 3 (which may be intrinsic germanium) and the substrate 1 (which may have a surface layer 1c made by intrinsic silicon), a superlattice stack 6 can be formed in a recess formed in the substrate 1 prior to forming the photosensitive member 3. The superlattice stack 6 provides an underlying starting surface that has an effective lattice constant closer to the photosensitive member 3 for epitaxially growing the photosensitive member 3. Specifically, the superlattice stack 6 includes a multiple ultrathin layer structure that includes a first material (substantially identical with the substrate 1, such as intrinsic silicon) and a second material (substantially identical with the photosensitive member 3, such as intrinsic germanium). In some embodiments, the superlattice stack 6 is a silicon-silicon germanium superlattice stack or intrinsic silicon-silicon germanium superlattice stack. Each of the ultrathin layers has a thinner thickness (such as less than about 20 nm, 10 nm or even less than 1 nm), thus the effect of lattice conformation is more effective, and a lattice constant each of the ultrathin layers in the superlattice stack 6 may be relatively closer to the lattice constant of the underlying layer. As a result, the starting surface for growing the photosensitive member 3 has a lattice constant closer to the photosensitive member 3, thus, the issue of dislocation defects may be alleviated.

Furthermore, in order to further improve the transitional adjustment of lattice constant of each ultra-thin layers, the distribution of concentration of the first material and the second material can be adjusted. Therefore, by having a first concentration of the second material (such as germanium or intrinsic germanium) at a first portion of the superlattice stack 6 proximal to the photosensitive member 3 greater than a second concentration of the second material at a second portion of the superlattice stack 6 distal to the photosensitive member 3 and below the first portion, the configuration of the superlattice stack 6 may further improve the transitional adjustment of the lattice constant. Such transitional adjustment of the lattice constant may allow the superlattice stack 6 to provide an improved starting surface (i.e. a top surface) for epitaxially growing the photosensitive member 3 thereon. Since the starting surface of the superlattice stack 6 may have an effective lattice constant closer to the photosensitive member 3, the dislocation issue caused by lattice mismatch (such as misfit dislocation and threading dislocation) may be alleviated.

In addition, in order to alleviate the issue of dopant diffusion, a diffusion barrier structure is disposed in the doped region. For example, the diffusion barrier structure DBS is formed in the second doped region DR2 having a second conductivity type (such as n-type), or in some cases, in the lightly doped region DR2-L. As previously discussed, during the fabrication operations that require elevated temperature, the photosensitive member 3 may suffer from the diffusion from the adjacent doped region. The diffusion barrier structure DBS is configured to laterally separate a portion of the second doped region DR2 from the photosensitive member 3. In order to alleviate dopant diffusion, especially from the second doped region DR2, the lateral distance X* between the sidewall of the photosensitive member 3 and the diffusion barrier structure DBS is in a range from about 20 nm to about 100 nm to reduce the quantity of dopant between the photosensitive member 3 and the diffusion barrier structure DBS without causing undesirably high resistance of the photo sensing device 100.

Furthermore, in order to improve the carrier injection efficiency and reduce the issue of carrier trapping due to band-offset between the semiconductor layer 1c and the photosensitive member 3, a portion of the photosensitive member 3 and a portion of the superlattice stack 6 adjacent/proximal to the first doped region DR1 (having a first conductivity type) can be further doped with the first conductivity type dopant. Similarly, a portion of the photosensitive member 3 and a portion of the superlattice stack 6 adjacent/proximal to the second doped region DR2 (having a second conductivity type) can be further doped with the second conductivity type dopant.

Some embodiments of the present disclosure provide a photo sensing device, including a substrate, including a substrate, includes a silicon layer at a front surface, a photosensitive member extending into and at least partially surrounded by the silicon layer, and a superlattice layer disposed between the photosensitive member and the silicon layer, wherein the superlattice layer includes a first material and a second material different from the first material, a first concentration of the second material at a portion of the superlattice layer proximal to the photosensitive member is greater than a second concentration of the second material at a portion of the superlattice layer distal to the photosensitive member.

Some embodiments of the present disclosure provide a photo sensing device, including a substrate, including a substrate, includes a silicon layer at a front surface, a photosensitive member extending into and at least partially surrounded by the silicon layer, a diffusion barrier structure extending into and at least partially surrounded by the silicon layer, and a superlattice layer disposed between the photosensitive member and the silicon layer, wherein the diffusion barrier structure is spaced away from a sidewall of the superlattice layer.

Some embodiments of the present disclosure provide a method for forming a photo sensing device, including providing a substrate, forming a recess in the substrate, forming a superlattice layer in the recess, wherein the superlattice layer includes a first material same as material in the silicon layer and a second material different from the first material, a first concentration of the second material of a first portion of the superlattice layer is less than a second concentration of the second material at a second portion of the superlattice layer above the first portion, and forming a photosensitive member over the superlattice layer, wherein the photosensitive member includes the second material.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A photo sensing device, comprising:
  a substrate, comprising a silicon layer at a front surface;
  a photosensitive member extending into and at least partially surrounded by the silicon layer;
  a first doped region having a first conductivity type at a first side of the photosensitive member, wherein the first doped region is in the silicon layer; and a second doped region having a second conductivity type different from the first conductivity type at a second side of the photosensitive member opposite to the first side, wherein the second doped region is in the silicon layer; and a superlattice layer disposed between the photosensitive member and the silicon layer, wherein the superlattice layer includes a first material and a second material different from the first material, a first concentration of the second material at a portion of the superlattice layer proximal to the photosensitive member is greater than a second concentration of the second material at a portion of the superlattice layer distal to the photosensitive member; and a diffusion barrier structure in the second doped region, wherein at least a portion of the diffusion barrier structure is laterally surrounded by the silicon layer.

2. The photo sensing device of claim 1, wherein the second doped region comprises a lightly doped region and a heavily doped region adjacent to the lightly doped region, and the diffusion barrier structure is disposed in the lightly doped region of the second doped region.

3. The photo sensing device of claim 1, wherein the first material is silicon and the second material is germanium.

4. The photo sensing device of claim 1, wherein a portion of the photosensitive member is protruded from the silicon layer.

5. The photo sensing device of claim 1, wherein a portion of the superlattice layer proximal to the second doped region is doped with a dopant having the second conductivity type.

6. The photo sensing device of claim 2, wherein a portion of the photosensitive member proximal to the first doped region is doped with a dopant having the first conductivity type.

7. A photo sensing device, comprising:
a substrate, comprising a silicon layer at a front surface;
a photosensitive member extending into and at least partially surrounded by the silicon layer;
a first doped region having a first conductivity type at a first side of the photosensitive member, wherein the first doped region is in the silicon layer; and
a second doped region having a second conductivity type different from the first conductivity type at a second side of the photosensitive member opposite to the first side, wherein the second doped region is in the silicon layer;
a diffusion barrier structure extending into and at least partially surrounded by the silicon layer, wherein the diffusion barrier structure comprises a diffusion barrier layer and a dielectric layer at least partially surrounded by the diffusion barrier layer; and
a superlattice layer disposed between the photosensitive member and the silicon layer, wherein the diffusion barrier structure is spaced away from a sidewall of the superlattice layer.

8. The photo sensing device of claim 7, wherein a portion of the silicon layer between the diffusion barrier structure and the sidewall of the superlattice layer is doped with an n-type dopant.

9. The photo sensing device of claim 7, wherein a lateral distance between the sidewall of the superlattice layer and the diffusion barrier structure is in a range from 20 nm to 100 nm.

10. The photo sensing device of claim 7, wherein the dielectric layer further comprises an upper portion covering the silicon layer.

11. The photo sensing device of claim 7, wherein the dielectric layer comprises at least one of the silicon nitride and silicon oxide.

12. The photo sensing device of claim 7, wherein the photosensitive member is laterally surrounded by the upper portion of the dielectric layer.

13. A method for forming a photo sensing device, comprising:
providing a substrate;
forming a trench at a top surface of the substrate;
forming a diffusion barrier structure in the trench;
forming a recess at the top surface of the substrate, wherein the recess is apart from the trench in a lateral direction;
forming a first doped region having a first conductivity type in the substrate; and
forming a second doped region having a second conductivity type different from the first conductivity type in the substrate;
forming a superlattice layer in the recess, wherein the superlattice layer includes a first material and a second material different from the first material, a first concentration of the second material of a first portion of the superlattice layer is less than a second concentration of the second material at a second portion of the superlattice layer above the first portion; and
forming a photosensitive member over the superlattice layer, wherein the photosensitive member includes the second material.

14. The method of claim 13, wherein the diffusion barrier structure is formed in the second doped region.

15. The method of claim 13, wherein forming the diffusion barrier structure comprises:
forming a diffusion barrier layer in the trench; and
forming a dielectric layer surrounded by the diffusion barrier layer.

16. The method of claim 13, wherein forming the photosensitive member comprises:
annealing the substrate subsequent to forming the diffusion barrier structure.

17. The method of claim 13, further comprising doping a dopant having the first conductivity type in a portion of the superlattice layer proximal to the first doped region.

18. The photo sensing device of claim 1, wherein at least a portion of the diffusion barrier layer is between a portion of the photosensitive member and a portion of the second doped region.

19. The photo sensing device of claim 1, wherein a bottom of the diffusion barrier structure is at a level below a top surface of the silicon layer.

20. The photo sensing device of claim 1, wherein the diffusion barrier structure comprises silicon oxide or silicon nitride.

* * * * *